US012020956B2

United States Patent
Lal et al.

(10) Patent No.: US 12,020,956 B2
(45) Date of Patent: Jun. 25, 2024

(54) HIGH TEMPERATURE ALUMINUM NITRIDE HEATER PEDESTAL WITH MULTI-ZONE CAPABILITY

(71) Applicant: Therm-X of California, Inc., Hayward, CA (US)

(72) Inventors: Annendra Lal, Hayward, CA (US); Ajit Sane, Medina, OH (US)

(73) Assignee: Therm-X of California, Inc., Hayward, CA (US)

( * ) Notice: Subject to any disclaimer, the term of this patent is extended or adjusted under 35 U.S.C. 154(b) by 441 days.

(21) Appl. No.: 16/854,724

(22) Filed: Apr. 21, 2020

(65) Prior Publication Data
US 2020/0350186 A1    Nov. 5, 2020

Related U.S. Application Data

(60) Provisional application No. 62/843,241, filed on May 3, 2019.

(51) Int. Cl.
*H01L 21/67* (2006.01)
*H05B 3/00* (2006.01)
*H05B 3/26* (2006.01)

(52) U.S. Cl.
CPC .. *H01L 21/67103* (2013.01); *H01L 21/67248* (2013.01); *H05B 3/0047* (2013.01);
(Continued)

(58) Field of Classification Search
CPC ......... H01L 21/67103; H01L 21/67248; H01L 21/68757; H01L 21/68785;
(Continued)

(56) References Cited

U.S. PATENT DOCUMENTS

| 4,024,629 A | 5/1977 | Lemoine et al. |
| 5,096,863 A | 3/1992 | Fukushima |

(Continued)

FOREIGN PATENT DOCUMENTS

| JP | H10273370 | 10/1998 |
| JP | 2007016272 | 1/2007 |

(Continued)

OTHER PUBLICATIONS

Wikipedia article entitled "Laminated object manufacturing" describing Laminated Object Manufacturing (LOM) developed by Helisys Inc. [Retrieved from the Internet on May 11, 2020 but believed to have been available to the public at least as early as Apr. 20, 2020]), 2 pages.

(Continued)

*Primary Examiner* — Sang Y Paik
(74) *Attorney, Agent, or Firm* — Crowell & Moring LLP; Thomas E. Williams

(57) ABSTRACT

Embodiments of an electric heater apparatus are disclosed. In one embodiment, an electric heater apparatus includes: (a) a first thermally conductive layer comprising an electrically insulating material; (b) one or more electrically conductive heating elements disposed in one or more grooves arranged on the top side of the first thermally conductive layer; and (c) a second thermally conductive layer disposed on the top side of the first thermally conductive layer over the one or more heating elements. The one or more heating elements include one or more refractory hard metals doped with at least one of carbon, nitrogen, aluminum, yttrium, or oxygen. The doped one or more refractory hard metals include a temperature insensitive electrical resistance over operational temperatures ranging from ambient temperature to about 850° C. as compared to undoped refractory hard metals. The (Continued)

one or more heating elements are independently controllable to provide one or more heating zones.

26 Claims, 20 Drawing Sheets

(52) U.S. Cl.
CPC ....... *H05B 3/265* (2013.01); *H05B 2203/005* (2013.01); *H05B 2203/011* (2013.01); *H05B 2213/07* (2013.01)

(58) Field of Classification Search
CPC ........ H01L 21/68792; H05B 2203/003; H05B 2203/005; H05B 2203/011; H05B 2203/016; H05B 2203/017; H05B 2213/07; H05B 3/0047; H05B 3/12; H05B 3/265; H05B 3/283
USPC ............................................ 219/443.1–444.1
See application file for complete search history.

(56) References Cited

U.S. PATENT DOCUMENTS

| | | | |
|---|---|---|---|
| 5,764,321 A | 6/1998 | Koyama et al. | |
| 5,876,550 A | 3/1999 | Feygin et al. | |
| 5,968,379 A | 10/1999 | Zhao et al. | |
| 6,067,222 A | 5/2000 | Hausmann | |
| 6,133,557 A | 10/2000 | Kawanabe et al. | |
| 6,261,708 B1 | 7/2001 | Ohashi et al. | |
| 8,481,896 B2 | 7/2013 | Quinton, Jr. | |
| 9,837,296 B2 | 12/2017 | Maeta et al. | |
| 2002/0185487 A1 | 12/2002 | Divakar et al. | |
| 2003/0044653 A1 | 3/2003 | Hiramatsu et al. | |
| 2004/0040952 A1* | 3/2004 | Suda | H01C 17/06513 219/548 |
| 2004/0070916 A1 | 4/2004 | Tsuruta et al. | |
| 2004/0142153 A1 | 7/2004 | Niwa | |
| 2004/0188413 A1 | 9/2004 | Natsuhara et al. | |
| 2006/0011611 A1 | 1/2006 | Goto et al. | |
| 2006/0186110 A1* | 8/2006 | Campello | H05B 3/145 219/444.1 |
| 2006/0199131 A1* | 9/2006 | Kawasaki | H01L 21/67103 432/120 |
| 2007/0181065 A1 | 8/2007 | Otaka et al. | |
| 2008/0016684 A1 | 1/2008 | Olechnowicz et al. | |
| 2011/0062144 A1 | 3/2011 | Akatsuka et al. | |
| 2012/0248716 A1 | 10/2012 | Nobori et al. | |
| 2013/0319762 A1 | 12/2013 | Harris et al. | |
| 2015/0260322 A1 | 9/2015 | Mako, Jr. et al. | |

FOREIGN PATENT DOCUMENTS

| | | |
|---|---|---|
| JP | 4849887 | 1/2012 |
| JP | 2016092105 | 5/2016 |
| TW | 201814826 | 4/2018 |
| WO | 2015/153756 | 10/2015 |

OTHER PUBLICATIONS

Taiwanese Patent Office, English translation of Search Report of the Taiwanese Office Action dated Jan. 25, 2021 in Taiwanese Patent Application No. 109114689 (dated Jan. 22, 2021) (1 page).

Taiwanese Patent Office, non-English Office Action and Search Report in Taiwanese Patent Application No. 109114689 (dated Jan. 25, 2021) (13 pages).

Senchenko, V. N. et al., "Experimental investigation of thermophysical properties of eutectic Mo—C, graphite and tantalum at high temperatures," Nov. 1, 2016, *Journal of Physics*: Conference Series 774 (2016) 012020. (9 pages).

The United States Patent and Trademark Office, International Search Report and Written Opinion in International Application No. PCT/US20/29152 (dated Aug. 11, 2020). (27 pages).

Office Action issued in TW Patent Application No. 109114689, dated Aug. 24, 2021 (22 pages).

* cited by examiner

HIGH TEMPERATURE ALUMINUM NITRIDE HEATER PEDESTAL WITH MULTI-ZONE CAPABILITY

CROSS REFERENCE

This application claims the benefit of U.S. Provisional Patent Application No. 62/843,241, filed on May 3, 2019, which is incorporated herein by reference in its entirety.

BACKGROUND

The instant disclosure relates to electric heaters, and more particularly, to heaters for use in the fabrication of semiconductor wafers, such as silicon wafers, gallium arsenide wafers, and the like.

Electric heaters for use in semiconductor wafer manufacturing may be employed for various steps in the manufacturing/processing of the wafers, including material deposition (e.g., physical or chemical vapor deposition), material removal (e.g., etching or planarization), patterning (e.g., lithography) and modification of electrical properties (e.g., doping and annealing). Such electric heaters must be able to withstand highly corrosive environments, be resistant to thermal shock under rapid temperature changes, and be able to tolerate extremely high temperatures for long periods of time. However, prior to the instant disclosure, known electric heaters for semiconductor wafer manufacturing: (1) are prone to relatively high variations in electrical resistivity at high temperatures, which drive a need for complicated and expensive temperature control, (2) are not easily capable of multi-zone heating, (3) have components that are prone to crack or fail due to thermal stress and thermal cycling and therefore lack durability and longevity, and (4) have components that cannot be co-fired together due to having different coefficients of thermal expansion, which causes additional manufacturing steps for their assembly.

Consequently, there exists a need for an apparatus that solves these and other problems.

SUMMARY

In one embodiment of the instant disclosure, an electric heater apparatus includes one or more thermally conductive layers and one or more heating elements embedded within or between the one or more thermally conductive layers, the one or more heating elements comprising molybdenum (Mo), tungsten (W), or any other refractory hard metal doped with at least one or more of carbon (C), nitrogen (N), aluminum (Al) or oxygen (O). In one embodiment, the heating element of the electric heater apparatus comprises molybdenum and molybdenum carbide ($Mo_2C$) such that the carbide content is greater than 5%.

The heating element of an electric heater apparatus according to the instant disclosure demonstrates, among other advantages, an improved stability in electrical resistivity at high temperatures, particularly in the range of about 300° C. to about 850° C., but also across the range from about ambient temperature to about 850° C.

In another embodiment, an electric heater apparatus for use in processing a semiconductor wafer in a wafer processing chamber is disclosed, including: (a) a first thermally conductive layer comprising an electrically insulating material, a top side, and a bottom side; (b) one or more electrically conductive heating elements disposed in respective ones of one or more grooves arranged on the top side of the first thermally conductive layer, the one or more heating elements comprising one or more refractory hard metals doped with at least one of carbon, nitrogen, aluminum, yttrium, or oxygen, the doped one or more refractory hard metals comprising a temperature insensitive electrical resistance over operational temperatures ranging from ambient temperature to about 850° C. as compared to undoped refractory hard metals, wherein the one or more heating elements are independently controllable to provide one or more heating zones along the top side of the first thermally conductive layer; and (c) a second thermally conductive layer disposed on the top side of the first thermally conductive layer over the one or more heating elements.

The first thermally conductive layer may include a disc. The first thermally conductive layer may be sintered, and the one or more heating elements may initially include a highly loaded one of a powder, a paint, or a pre-cut pattern from a polymer sheet prior to sintering the first thermally conductive layer. A concentration of carbon may be allowed to vary from about 0.1 at % to about 50 at %, a concentration of aluminum may be allowed to vary from about 0.1 at % to about 20 at %, a concentration of nitrogen may be allowed to vary from about 0 at % to about 20 at %, a concentration of oxygen may be allowed to vary from about 0 at % to about 5 at %, and a concentration of yttrium may be allowed to vary from about 0 at % to about 3 at %. The first thermally conducting layer includes aluminum nitride.

The electric heater apparatus may include a third thermally conductive layer disposed on the bottom side of the first thermally conductive layer. The third thermally conductive layer may include a hub. The second and third thermally conductive layers may include aluminum nitride. The electric heater apparatus may include a sintered riser affixed to the hub. Alternatively, a sintered riser may be bonded to the hub, and the bonded riser may create a helium tight seal with the hub. The electric heater apparatus may include one or more electrical interconnects disposed in respective ones of one or more channels arranged on the bottom side of the first thermally conductive layer. The interconnects may be configured to communicate electricity in a circuit from the hub to the one or more heating elements and from the one or more heating elements to the hub. The interconnects may be configured to communicate sensor data from one or more temperature sensors to the hub. The one or more temperature sensors may be disposed in respective ones of one or more channels arranged on the bottom side of the first thermally conductive layer and under the third thermally conductive layer. The third thermally conductive layer may be disposed over the one or more temperature sensors.

The one or more heating elements and the first thermally conductive layer may include a functionally similar coefficient of thermal expansion to avoid deleterious cracks or fissures in the electric heater apparatus.

In another embodiment, an electric heater apparatus for use in processing a semiconductor wafer in a wafer processing chamber is disclosed, including: (a) a sintered disc comprising a thermally conductive and electrically insulating material, a top side, and a bottom side; (b) one or more electrically conductive heating elements disposed in respective ones of one or more grooves arranged on the top side of the disc, the one or more heating elements comprising one or more refractory hard metals doped with at least one of carbon, nitrogen, aluminum, yttrium, or oxygen, the doped one or more refractory hard metals comprising a temperature insensitive electrical resistance over operational temperatures ranging from ambient temperature to about 850° C. as compared to undoped refractory hard metals, wherein the one or more heating elements are independently controllable to provide one or more heating zones along the top side of the disc; (c) a first thermally conductive layer disposed on the top side of the disc over the one or more heating elements; (d) one or more interconnects disposed in respective ones of one or more channels arranged on the bottom side of the disc; and (e) a second thermally conductive layer disposed on the bottom side of the disc over the one or more interconnects, the second thermally conductive layer comprising a hub, wherein the one or more electrically conductive heating elements are protected from chemical attack.

A concentration of carbon may be allowed to vary from about 0.1 at % to about 50 at %, a concentration of aluminum may be allowed to vary from about 0.1 at % to about 20 at %, a concentration of nitrogen may be allowed to vary from about 0 at % to about 20 at %, and a concentration of oxygen may be allowed to vary from about 0 at % to about 5 at %, and a concentration of yttrium may be allowed to vary from about 0 at % to about 3 at %. The thermally conducting and electrically insulating material may be aluminum nitride. The first and second thermally conductive layers may include aluminum nitride.

The electric heater apparatus may include a riser affixed to the hub. The riser may be bonded to the hub, and the bonded riser may create a helium tight seal with the hub. The interconnects may include one or more electrical interconnects, and the electrical interconnects may be configured to communicate electricity in a circuit from the hub to the one or more heating elements and from the one or more heating elements to the hub.

The electric heater apparatus may include one or more temperature sensors disposed in the one or more channels. The second thermally conductive layer may be disposed over the one or more temperature sensors. The one or more heating elements and the disc may include a functionally similar coefficient of thermal expansion to avoid deleterious cracks or fissures in the electric heater apparatus. The one or more heating elements may be independently controllable to provide one or more heating zones along the top side of the disc.

In another embodiment, a method of manufacturing an electric heater apparatus for use in processing a semiconductor wafer in a wafer processing chamber is disclosed, comprising: (a) preparing a disc comprising aluminum nitride comprising a sintering aid comprising yttria from about 3 to about 5 wt %, a top side, and a bottom side; (b) fabricating one or more grooves on the top side of the disc; (c) depositing one or more electrically conductive heating elements in respective ones of one or more grooves arranged on the top side of the disc, the one or more heating elements comprising one or more refractory hard metals doped with at least one of carbon, nitrogen, aluminum, yttrium, or oxygen, the doped one or more refractory hard metals comprising a temperature insensitive electrical resistance over operational temperatures ranging from ambient temperature to about 850° C. as compared to undoped refractory hard metals, wherein the one or more heating elements are independently controllable to provide one or more heating zones along the top side of the disc; (d) depositing a first powder comprising aluminum nitride on the top side of the disc over the one or more heating elements; (e) pressing the disc in a die at least once to consolidate the first powder; (f) fabricating one or more channels on the bottom side of the disc; (g) depositing one or more electrically conductive interconnects in the one or more channels on the bottom side of the disc; (h) depositing a second powder comprising aluminum nitride on the bottom side of the disc over the one or more interconnects; (i) pressing the disc in a die at least once to consolidate the second powder; (j) machining and grinding the pressed disc to include a hub, the pressed and machined disc defining an aluminum nitride matrix having embedded heating elements and interconnects; (k) sintering the aluminum nitride matrix at temperatures ranging from about 1600° C. to about 1850° C., wherein the step of sintering is performed in a nitrogen environment under controlled heating to burn off any temporary binders in the aluminum nitride matrix, wherein an amount of carbon is maintained below an oxygen content of aluminum nitride in the aluminum nitride matrix that is not associated with yttria so that a composition of a liquid phase of alumina and yttria is such that $Al_2O_3/Y_2O_3$ molar ratio in the sintered aluminum nitride matrix is 10:3 to 0.1:1, wherein a portion of the amount of carbon is incorporated in the doped one or more refractory hard metals of the one or more electrically conductive heating elements, wherein sintering forms a densified aluminum nitride matrix including densified one or more electrically conductive heating elements within the sintered aluminum nitride matrix; and (l) bonding a sintered riser to the hub.

These and other embodiments are described herein.

BRIEF DESCRIPTION OF THE DRAWINGS

For a better understanding of the features described in this disclosure, reference may be made to embodiments shown in the drawings. The components in the drawings are not necessarily to scale, and related elements may be omitted so as to emphasize and clearly illustrate the novel features described herein. In addition, system components can be variously arranged, as known in the art. In the figures, like referenced numerals may refer to like parts throughout the different figures unless otherwise specified.

DETAILED DESCRIPTION

Figure 1:
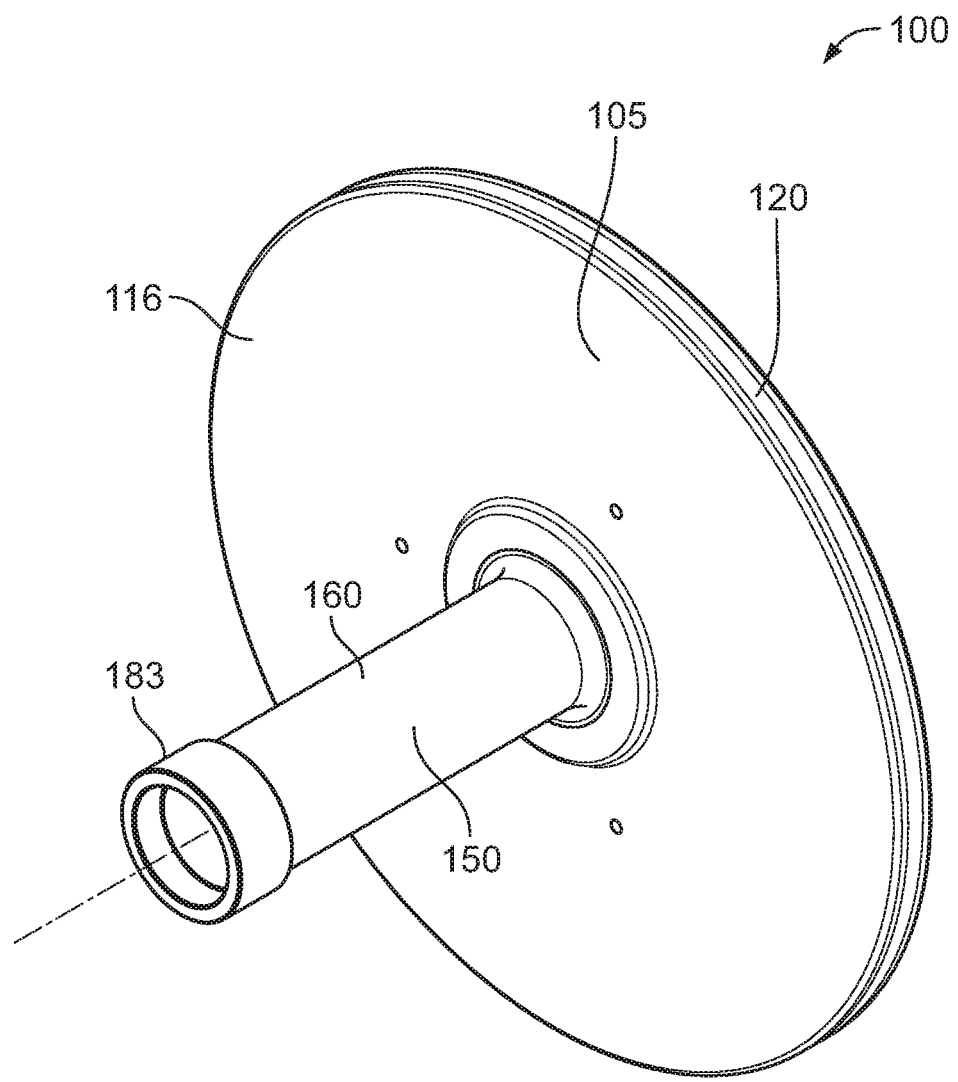
FIG. 1 is a bottom perspective view of an embodiment of an electric heater of the instant disclosure.

While the features, methods, devices, and systems described herein may be embodied in various forms, there are shown in the drawings, and will hereinafter be described, some exemplary and non-limiting embodiments. Not all of the depicted components described in this disclosure may be required, however, and some implementations may include additional, different, or fewer components from those expressly described in this disclosure. Variations in the arrangement and type of the components may be made without departing from the spirit or scope of the claims as set forth herein. Thus, it should be appreciated that any of the features of an embodiment discussed with reference to the figures herein may be combined with or substituted for features discussed in connection with other embodiments in this disclosure.

The instant disclosure describes various aspects of at least one embodiment of an electric heater apparatus for manufacturing semiconductor wafers. The various embodiments of an electric heater apparatus provide numerous benefits. For example, the electric heater apparatuses of the instant disclosure provide an electric resistive heater with relatively low resistance change (i.e., the electrical resistance is relatively insensitive to temperature change) during operation in the range of about ambient temperature to about 850° C., and particularly in the range of about 300° C. to about 850° C., as compared to their metallic counterparts over the same tested temperature. Other benefits include:

a. The heating element composition and its porosity permit shrinkage that is compatible with the shrinkage of aluminum nitride. Because there is no excessive mismatch in shrinkage, the resultant heating element comprising one or more heating elements embedded in an aluminum nitride matrix does not create deleterious internal fissures or cracks.

b. The heating element composition upon sintering with aluminum nitride has a coefficient of thermal expansion that is reasonably close to that of aluminum nitride so that there are no cracks that are detrimental to the performance of the heater.

c. The embodiments described herein comprise a multilayer heating element disc and riser assembly with a strong joint that is capable of being helium leak tight.

d. The embodiments described herein provide a scalable design for providing single or multiple heating zones, and allow the design of various multi-zone heater configurations with functional temperature uniformity in the range of about ambient temperature to about 850° C.

e. The embodiments described herein allow additional or multiple thermocouple temperature sensors beyond that of known devices—all of which are capable of surviving the heater fabrication process, including steps that involve compression of the components, embedding the components, and exposing the components to high sintering temperatures ranging from about 1600° C. to about 1850° C.

f. The embodiments described herein provide a solution capable of delivering high power required for high temperature operation due to high radiation heat loss.

g. The embodiments described herein include electrical connection systems, which connect power and sensor conductors to thermal elements, that are suitable for high temperature use and can withstand the heater fabrication process as disclosed herein.

h. The embodiments described herein allow the ability to incorporate or use standard temperature control systems to operate the electric heater apparatus because the heating element does not have large resistance change over temperature. Accordingly, use of a heating element having an electrical resistance that is relatively insensitive to temperature over the range of operating temperatures avoids the need for more complicated controllers, control considerations, and switching components.

i. The embodiments described herein provide a multi-zone electric heater apparatus configured to enable operational temperatures from ambient temperature to about 850° C.

j. The embodiments described herein are etch resistant.

Turning to the figures, there are shown various embodiments of an electric heater apparatus. For example, FIG. 1 shows one embodiment of an electric heater apparatus 100 according to the instant disclosure. Electric heater apparatus 100 includes riser post 150 affixed thereto. Riser post 150 is configured for attachment to a feedthrough (not shown) to transition the electric heater apparatus 100 to an atmospheric environment outside the semiconductor wafer processing chamber.

Referring to FIGS. 2-18, various aspects of electric heater apparatus 100 are shown. For example, electric heater apparatus 100 includes disc assembly 105 and riser post 150 affixed thereto. Disc assembly 105 includes one or more heating elements 110 and thermal conductive layer 140 positioned on top side 115 of disc 120. Disc assembly 105 includes interconnections 125, thermal conductive layer 145, and sockets 135 positioned on bottom side 116 of disc 120. Riser post 150 of electric heater apparatus 100 is generally tubular and perpendicularly extends from the bottom side 116 of disc 120 after being joined to disc assembly 105. One of ordinary skill would appreciate that the top side 115 of disc 120 is the wafer side, and that the bottom side 116 provides a portion of the connection to the outside of the wafer processing chamber.

Disc 120 may be configured as a disc or a plate and may have a circular, semi-circular, or any other plan geometry. According to the embodiments shown in the figures, disc 120 has a circular plan geometry and may be manufactured in any diameter, such as 150 mm, 200 mm, 300 mm or 450 mm diameters, for example. Disc 120 may be configured with a thermally conductive and electrically insulative material. In the embodiments shown in the figures, a suitable thermally conductive and electrically insulative material comprises aluminum nitride comprising a sintering aid, which may include yttria in an amount from about 3 wt % to about 5 wt %. In other embodiments, in addition to or instead of yttria, the aluminum nitride powder may include a small amount (i.e., less than 5 wt %) of alkaline earth metal oxides, including calcium oxide. The aluminum nitride and sintering aid, if present, may be also be combined with suitable binders. The aluminum nitride ceramic powders with binders may be consolidated under sufficient pressure in a mold to form disc 120. Thermal conductive layers 140,145 of disc assembly 105 may also be made from aluminum nitride to ensure thermal compatibility with one another.

Figure 3:
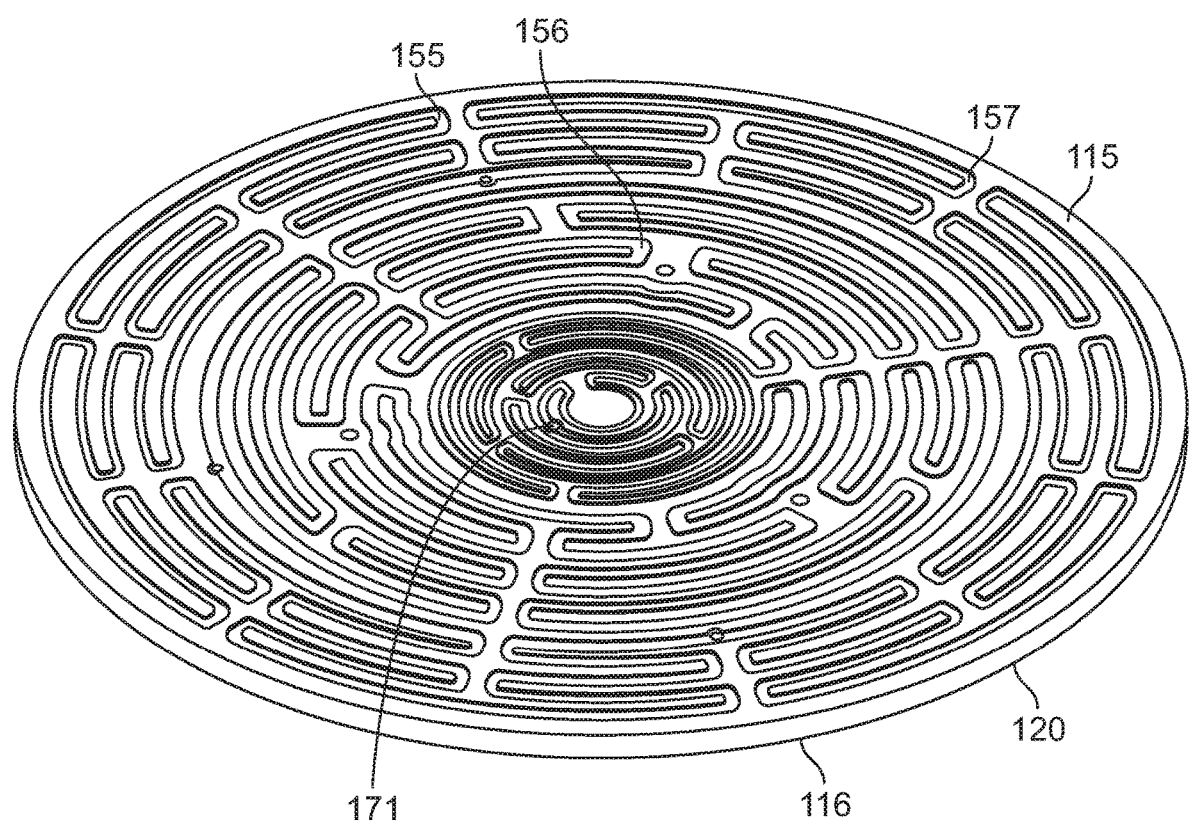
FIG. 3 illustrates a top perspective view of the disc assembly of the electric heater of FIG. 1 with grooves shown in the top side of the disc of the disc assembly.
Figure 4:
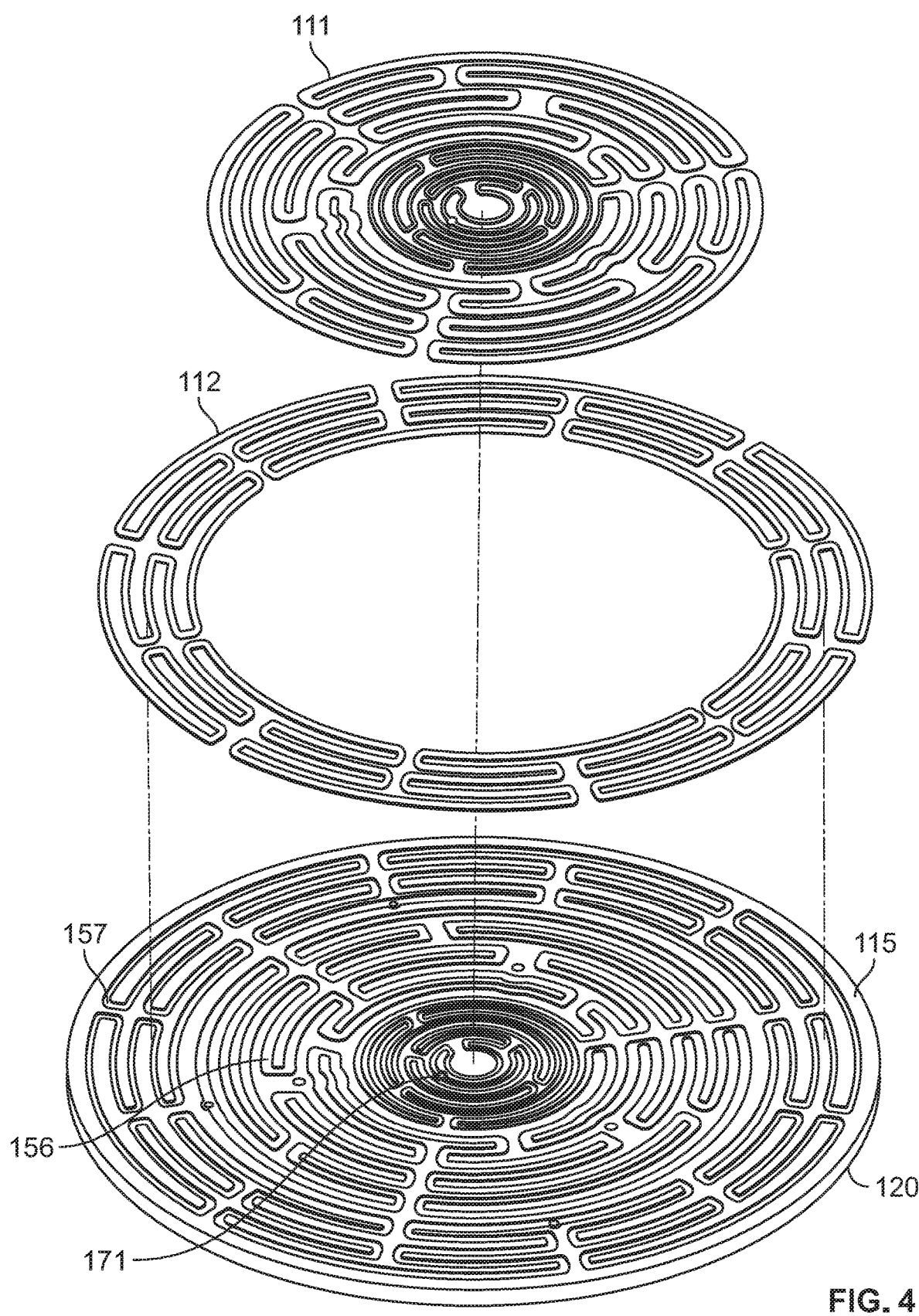
FIG. 4 illustrates a top exploded perspective view of the disc of FIG. 3 together with respective inner and outer heating elements.
Figure 19:
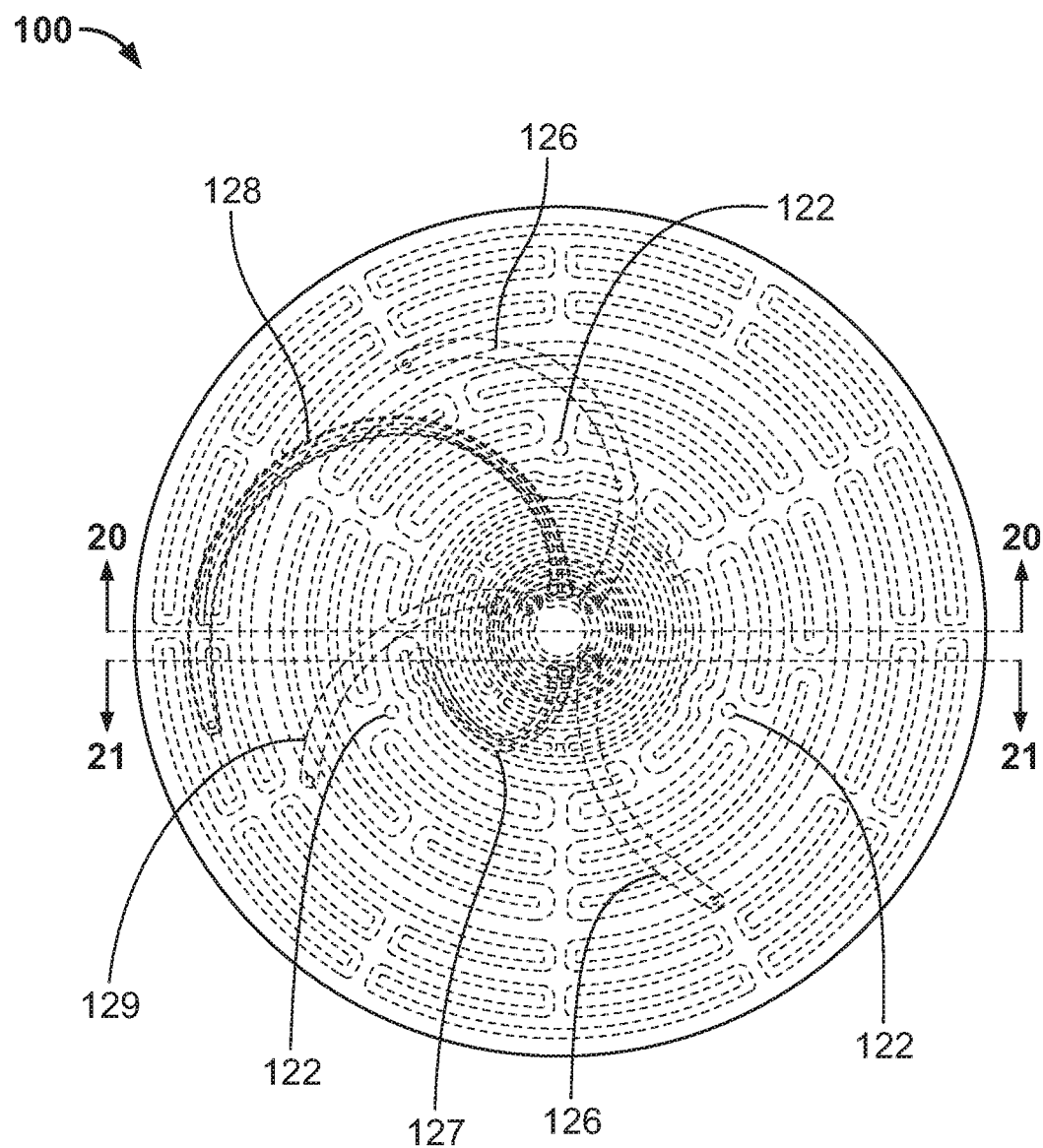
FIG. 19 is a top transparent plan view of an embodiment of the electric heater apparatus of FIG. 18.
Figure 20:
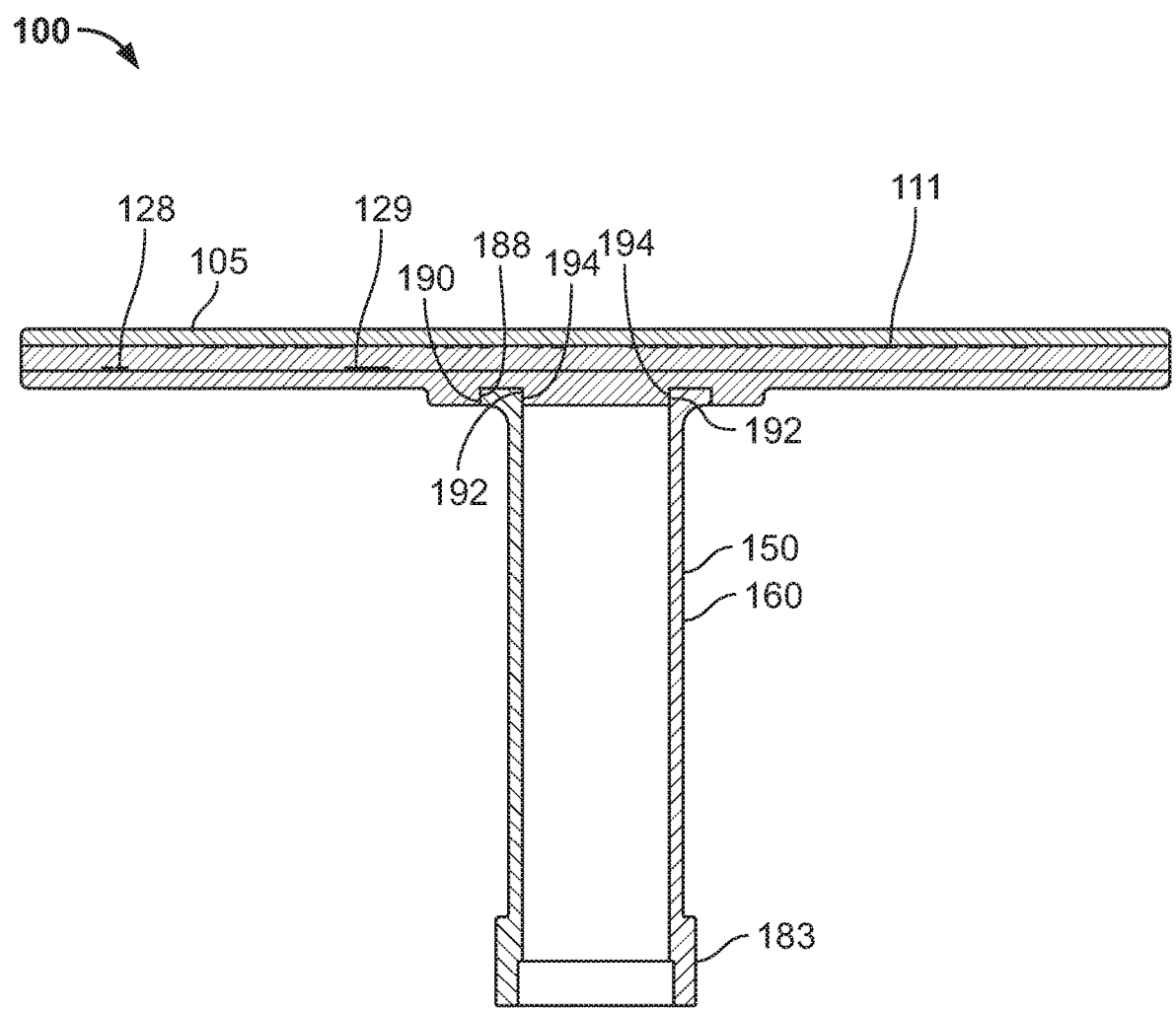
FIGS. 20 and 21 are cross section views of the electric heater apparatus of FIG. 19 taken along line 20-20 and 21-21, respectively.
Figure 21:
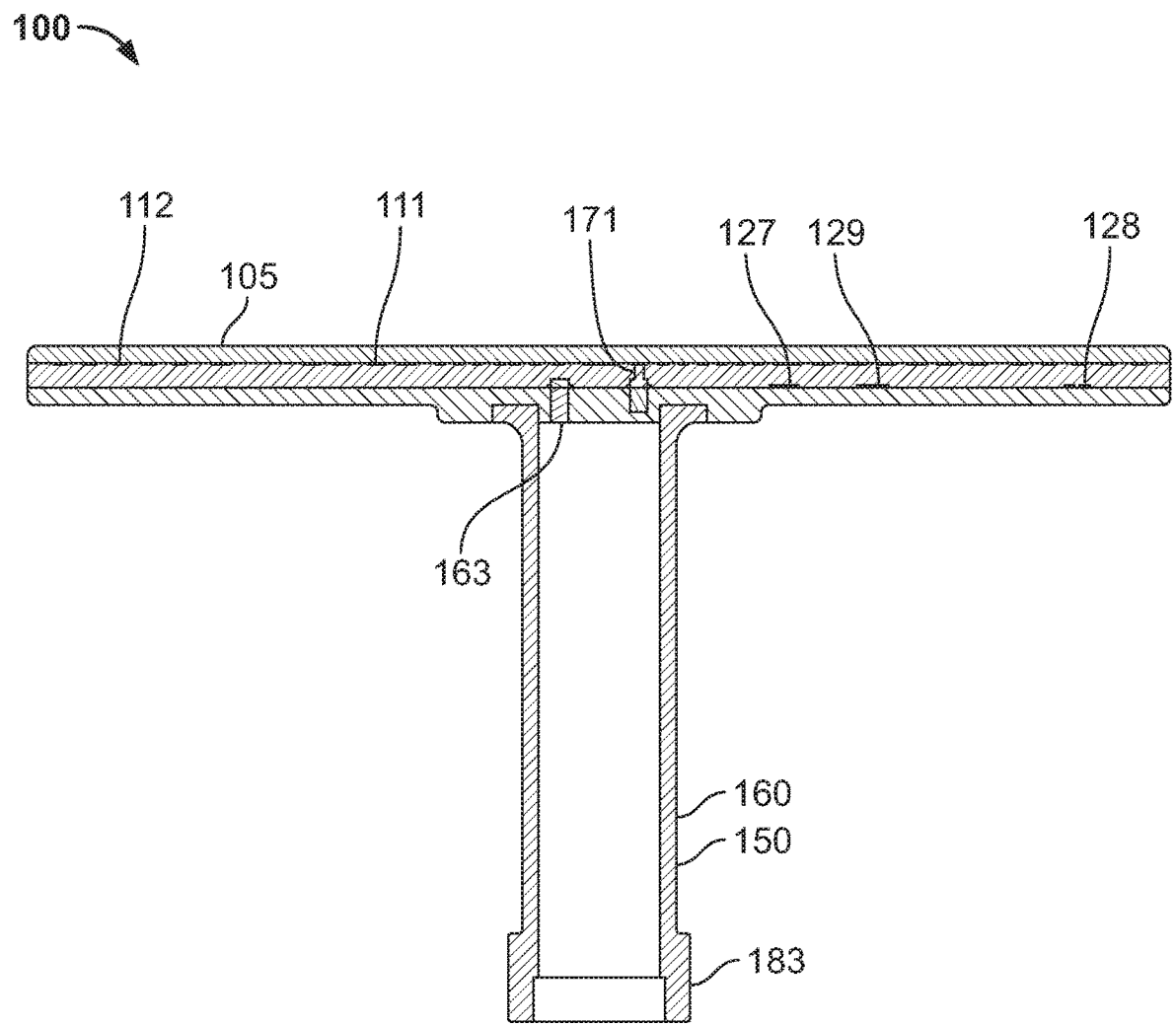

Disc 120 is configured with grooves 155 positioned on the top side 115 of disc 120 to receive one or more heating elements 110. In this way, disc 120 may act as a substrate for the one or more heating elements 110. As best illustrated in the embodiments of FIGS. 3, 4 and 19, grooves 155 include inner groove 156 and outer groove 157, each defined as a continuous channel with no beginning or end. In other embodiments, one or more of grooves 155 may have a serpentine or other shape with defined ends. Inner groove 156 and outer groove 157 of grooves 155 are further defined by a plurality of arcuate, spaced apart channel portions that zig-zag across the top side 115 of disc 120 in a common plane. In other embodiments, grooves 155 may be configured to receive a single heating element. In other embodiments, grooves 155 may be configured to receive more than two heating elements.

Although the spaced apart channel portions of outer groove 157 of disc 120 are approximately radially equidistant from one another, as shown in FIG. 3, at least some of the spaced apart, zig-zagged channel portions of inner groove 156 are radially closer to one another than to other spaced apart, zig-zagged channel portions of inner groove 156. In this way, the radial density of the channel portions may be higher or lower in different portions or areas of the top side 115 of the disc 120. In some embodiments, the radial spacing of the arcuate, zig-zagged channel portions may be relatively constant with respect to one another as the channels traverse in an arcuate and zig-zag pattern from the center of the top side 115 of the disc 120 radially outward. In other embodiments, the radial spacing of the arcuate, zig-zagged channel portions may vary. In some embodiments, the circumferential spacing of the channel portions may be relatively constant, may vary, or be higher or lower in different portions or areas of the top side 115 of disc 120.

In other embodiments, the pattern and geometry of grooves 155 may include any desired pattern, depth, and width. For example, in some embodiments, grooves 155 may be spirally arranged on the top side 115 of disc 120. In some embodiments, the internal geometry of the grooves 155 may comprise a flat bottom wall and have opposed side walls oriented perpendicularly to the bottom wall. In other embodiments, the internal geometry of grooves 155 may include sloped, conical, or rounded sidewalls and/or bottom wall or any other geometry. In some embodiments, the width of the channels may be optimized, either across the disc 120 or locally, using thermal analysis to achieve an optimum thermal uniformity.

Figure 5:
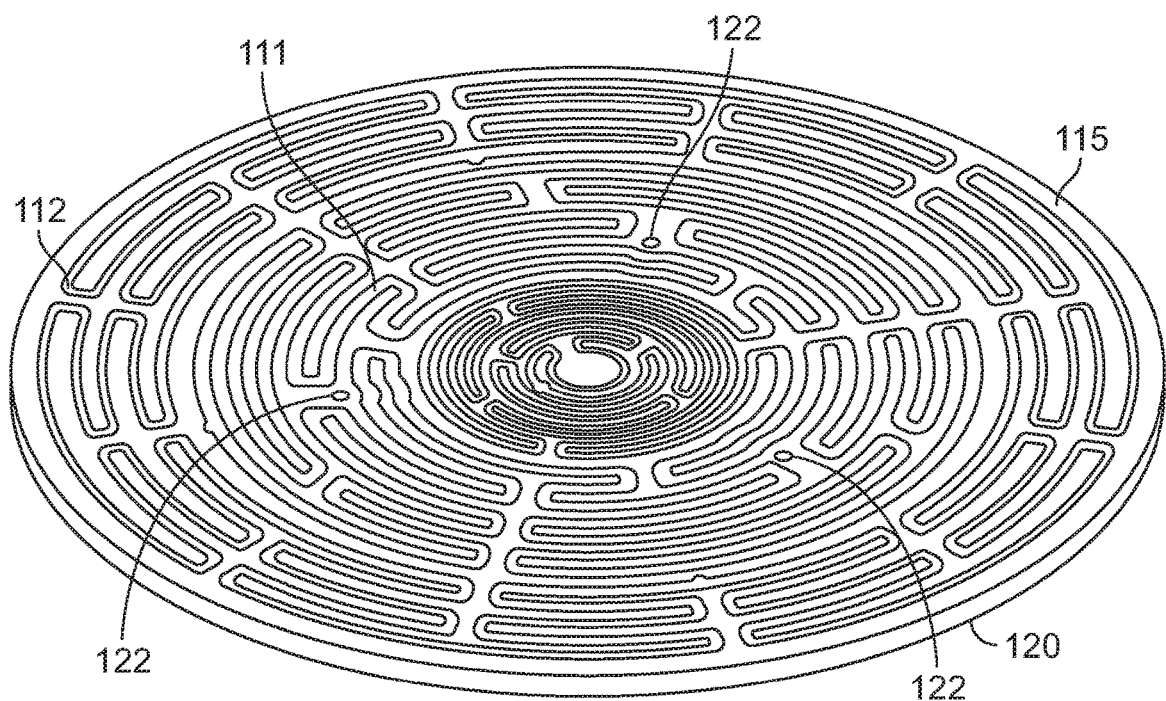
FIG. 5 illustrates a top perspective view of the disc of FIG. 4 after installation of the respective inner and outer heating elements into the grooves in the disc.

As shown in the embodiments of FIGS. 4 and 5, the one or more heating elements 110 include inner heating element 111 and outer heating element 112 positioned in or received by a respective inner groove 156 and outer groove 157. In some embodiments, the one or more heating elements 110 may be embedded within or between the thermal conductive layers 140,145 and/or disc 120. For example, rather than forming grooves 155 in the top side 115 of disc 120, grooves 155 may instead be disposed in the bottom side of thermal conductive layer 140 to receive the one or more heating elements. Although a pair of heating elements are shown in the figures, in other embodiments, either only one heating element or more than two heating elements may be arranged on the top side 115 of disc 120. Multiple heating elements can be controlled by a controller to provide differential heating or substantially uniform heating across top side 115 of disc 120.

In at least this embodiment, the one or more heating elements 110 include doped molybdenum or molybdenum-containing carbides, or equivalent compounds of refractory hard metals such as tungsten or their alloys. The preferred doping of molybdenum involves carbon, aluminum, and possibly nitrogen, oxygen and yttrium.

The carbon dopant is generated or otherwise added to metallic powders associated with the electrically conductive one or more heating elements 110 during binder burn-out while sintering the disc assembly 105. During this process, the part is heated in the range of about 1600° C. to about 1850° C. in an inert or substantially inert atmosphere to pyrolyze the binders in such a way to produce the desired amount of residual carbon. The amount of carbon created by this process is kept below the oxygen content of aluminum nitride that is not associated with yttria so that the composition of the liquid phase of alumina and yttria is such that $Al_2O_3/Y_2O_3$ molar ratio in the sintered body is between 10:3 to 0.1:1. A part of this carbon is incorporated in the molybdenum powder which shrinks and sinters to create a dense heating element within the aluminum nitride matrix. The remainder of the carbon reacts with $Al_2O_3$ to form aluminum nitride and carbon monoxide. At high temperature, typically in the range of about 1600° C. to about 1850° C., due to interactions between aluminum nitride, molybdenum, carbon and the sintering aid of alumina-yttria (as described above), in a nitrogen atmosphere, the composition of the one or more heating elements 110 is allowed to approach chemical equilibrium resulting in desired composition of the one or more heating elements 110. The other dopants such as aluminum, nitrogen, oxygen, and yttrium may get added simply by high temperature interactions between the conductive heating element constituents and the surrounding aluminum nitride matrix. The concentration of carbon, aluminum, nitrogen, oxygen, and yttrium can be allowed to vary within the following ranges:

Carbon: 0.1-50 at %
Aluminum: 0.1-20 at %
Nitrogen: 0-20 at %
Oxygen: 0-5 at %
Yttrium 0-3 at %

It should be noted that SEM/EDS analysis may be insensitive to trace to small amounts of boron. Typically, if boron concentrations become greater than ~10%, it may be detected if there is no interference from other elements in the spectral analysis. Since boron could be present on account of its use as boron nitride (or boron nitride in combination with aluminum nitride machinable ceramic) to provide inert support during binder burn-off and/or sintering, it cannot be excluded from a possible composition. Therefore, in a manner described above for dopants like aluminum, nitrogen and oxygen, boron may get added during the high temperature interactions during sintering, but it may not get detected using traditional SEM/EDS analysis. Therefore, boron as a dopant generally in the range from 0 to the detection limit, which is about 10 at %, cannot be ruled out.

The compositions of the one or more heating elements 110 involve non-metallic elements such as carbon, nitrogen and oxygen along with trace amounts of boron and those found in aluminum nitride ceramic, namely, aluminum, yttrium—all as determined by SEM/EDS analysis. Non-metallic elements may be added either by direct addition of precursors, such as organic binders that yield residual amount of carbon during their pyrolysis in the binder burn-off step, or by direct addition of particulate carbon, which would be incorporated only in the heating element forming either a solid solution of molybdenum and carbon or molybdenum carbide (either $Mo_2C$ or $MoC$). X-Ray diffraction analysis showed that the heating element contains a mixture of molybdenum and molybdenum carbide along with trace of unidentified phases due to insufficient number of peaks. In one case, molybdenum to molybdenum carbide as $Mo_2C$, ratio was nearly 2:1.

Since parts are fired in a nitrogen atmosphere with a liquid forming oxide sintering phase ($A2O3-Y_2O_3$), the composition of the one or more heating elements 110 may include trace to small amounts of aluminum, yttrium and oxygen. Since it is well-known that addition of small dopants can affect electrical properties of metals and ceramics (a compound of metal and a non-metal), presence of trace to small amounts of elements in the heating element/electrode compositions must be considered.

Figure 28:
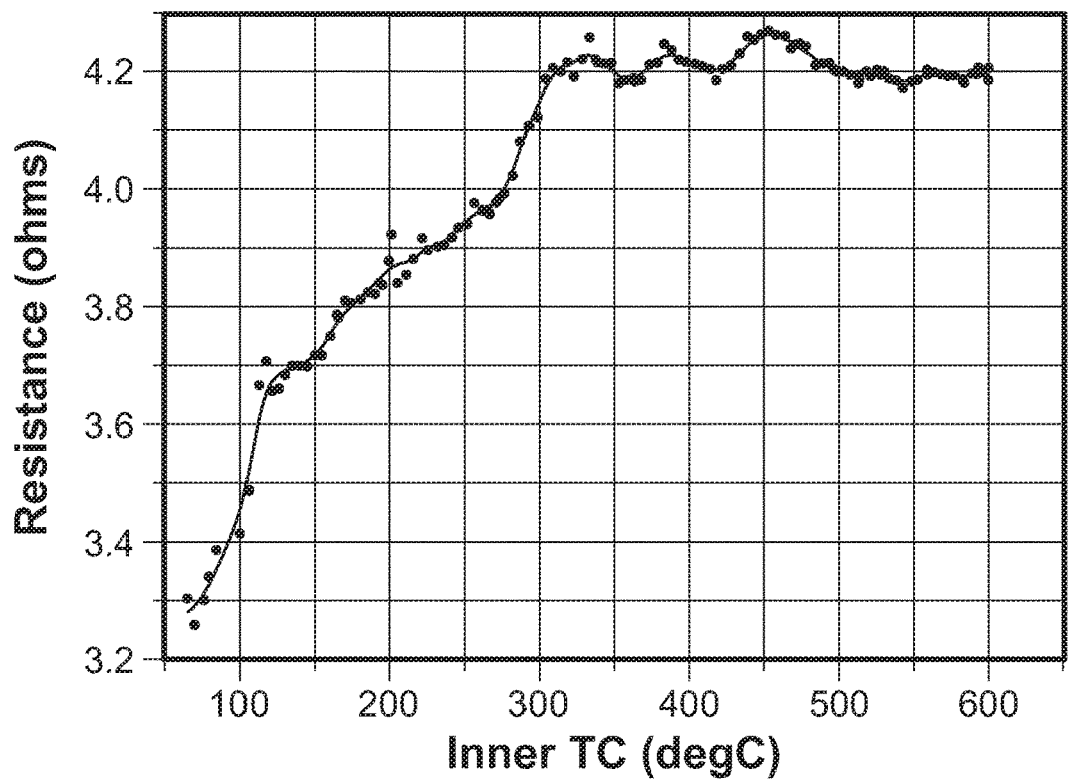
FIG. 28 illustrates resistance data captured from a representative heating element of the instant disclosure.

The one or more heating elements 110 as described provides several highly desirable characteristics, including: (1) an ability to withstand thermal stresses (i.e., a coefficient of thermal expansion sufficiently close to that of the ceramic matrix of the disc assembly 105); (2) chemical compatibility (i.e., inertness) with respect to the ceramic matrix; (3) an ability to be co-fired with the ceramic matrix; and, (4) of particular note, an improved stability in electrical resistivity as a function of temperature, particularly at high operating temperatures. In fact, the one or more heating elements 110 as described is observed to have relatively low change in electrical resistivity (i.e., the electrical resistance is relatively insensitive to temperature change) in the desired operating range of about ambient temperature to about 850° C., due to a relatively low coefficient of electrical resistivity measured at approximately 0.001 (1/K) from about ambient temperature to about 850° C. compared to pure molybdenum, which has a coefficient of electrical resistivity of 0.005 (1/K) over the same temperatures. In one embodiment, as shown in FIG. 28, the electrical resistance ranged from about 4.18 ohm to about 4.28 ohm over a temperatures that ranged from about 300° C. to about 600° C.

Figure 6:
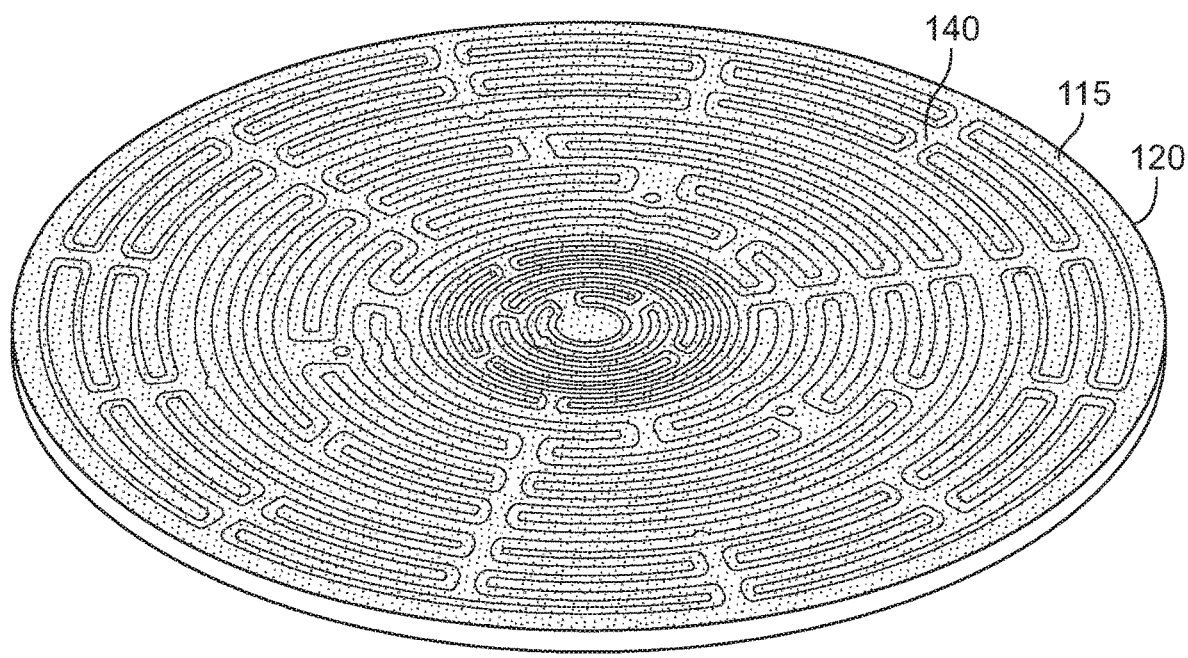
FIG. 6 illustrates a top perspective view of the disc of FIG. 5 after deposition of a thermally conductive powder on the top side of the disc.
Figure 7:
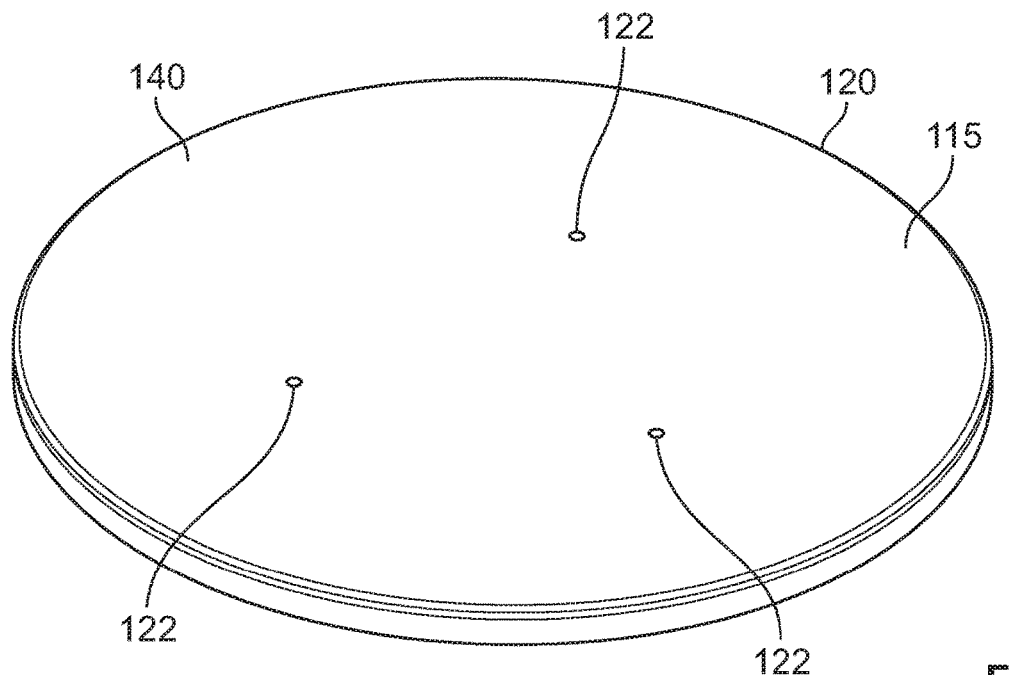
FIG. 7 illustrates a top perspective view of the disc of FIG. 6 after compacting the thermally conductive powder onto the disc of FIG. 6.

FIG. 6 shows thermal conductive layer 140 initially disposed on the top side 115 of disc 120 in the form of an aluminum nitride powder. The powder is consolidated with binders under pressure to form a machinable surface. As shown in FIG. 7, the composite disc 120/thermal conductive layer 140 is drilled in 3 places to form holes 122 for indexing, clocking of the disc assembly 105. As shown in FIG. 19, holes 122 do not interfere with the one or more heating elements 110 or interconnections 125.

Figure 2:
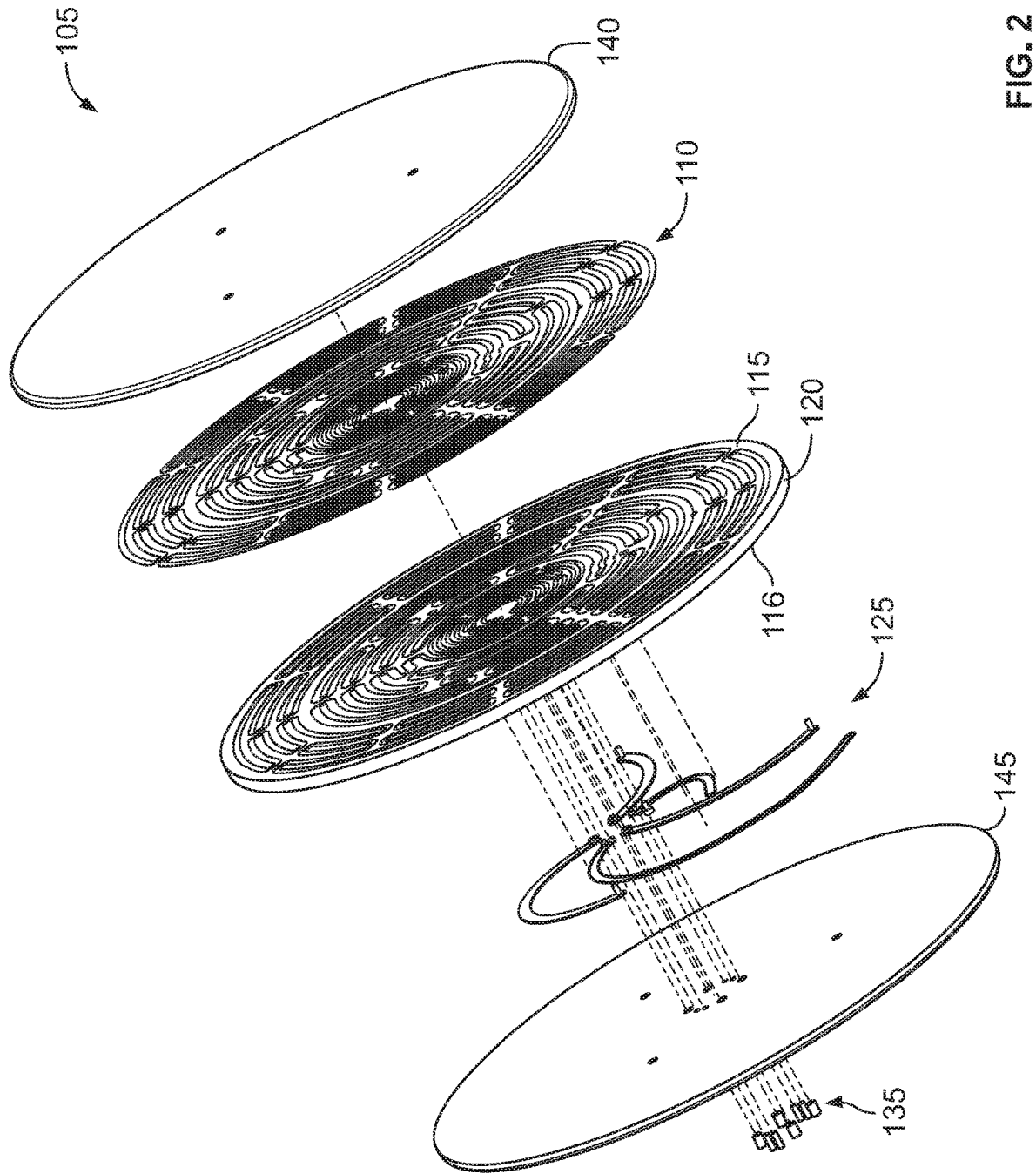
FIG. 2 illustrates an exploded top perspective view of a portion of the electric heater of FIG. 1.
Figure 8:
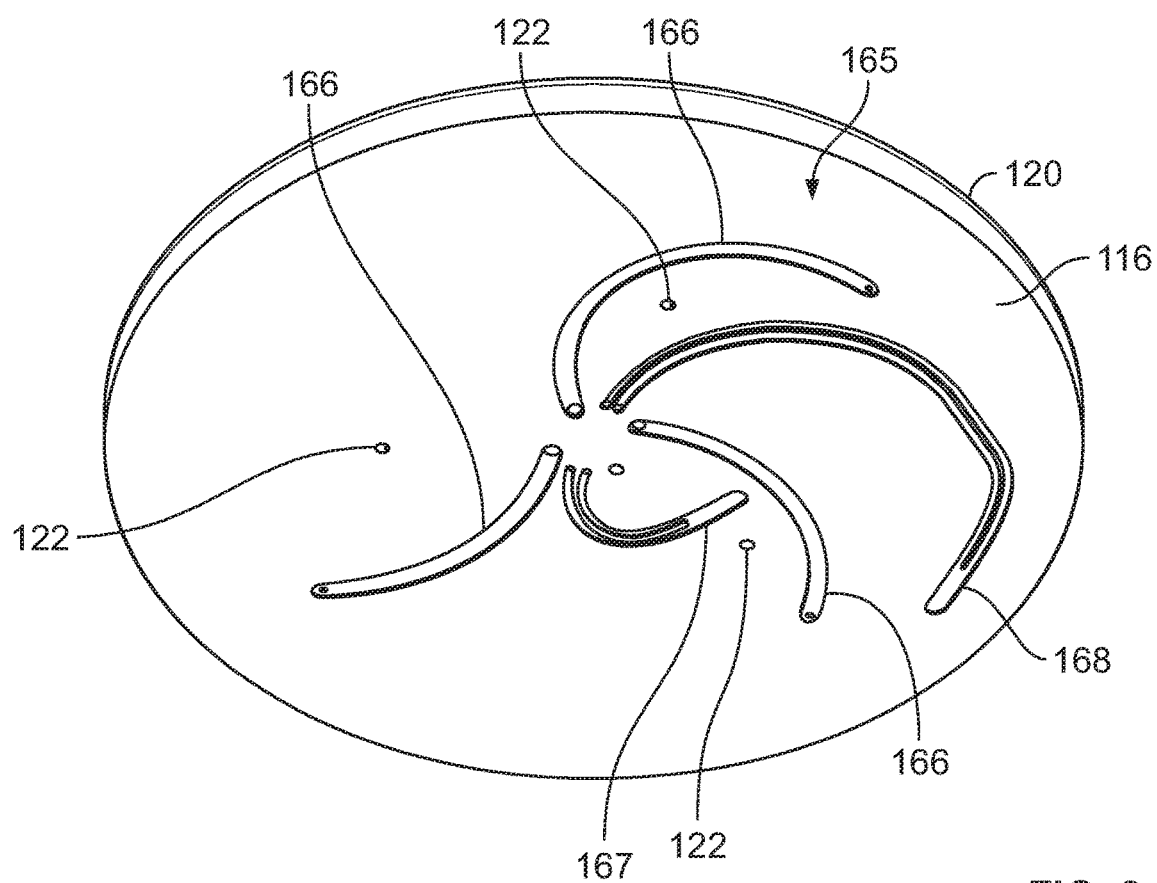
FIG. 8 illustrates a bottom perspective view of the disc of FIG. 7 with grooves shown in the bottom side of the disc.
Figure 9:
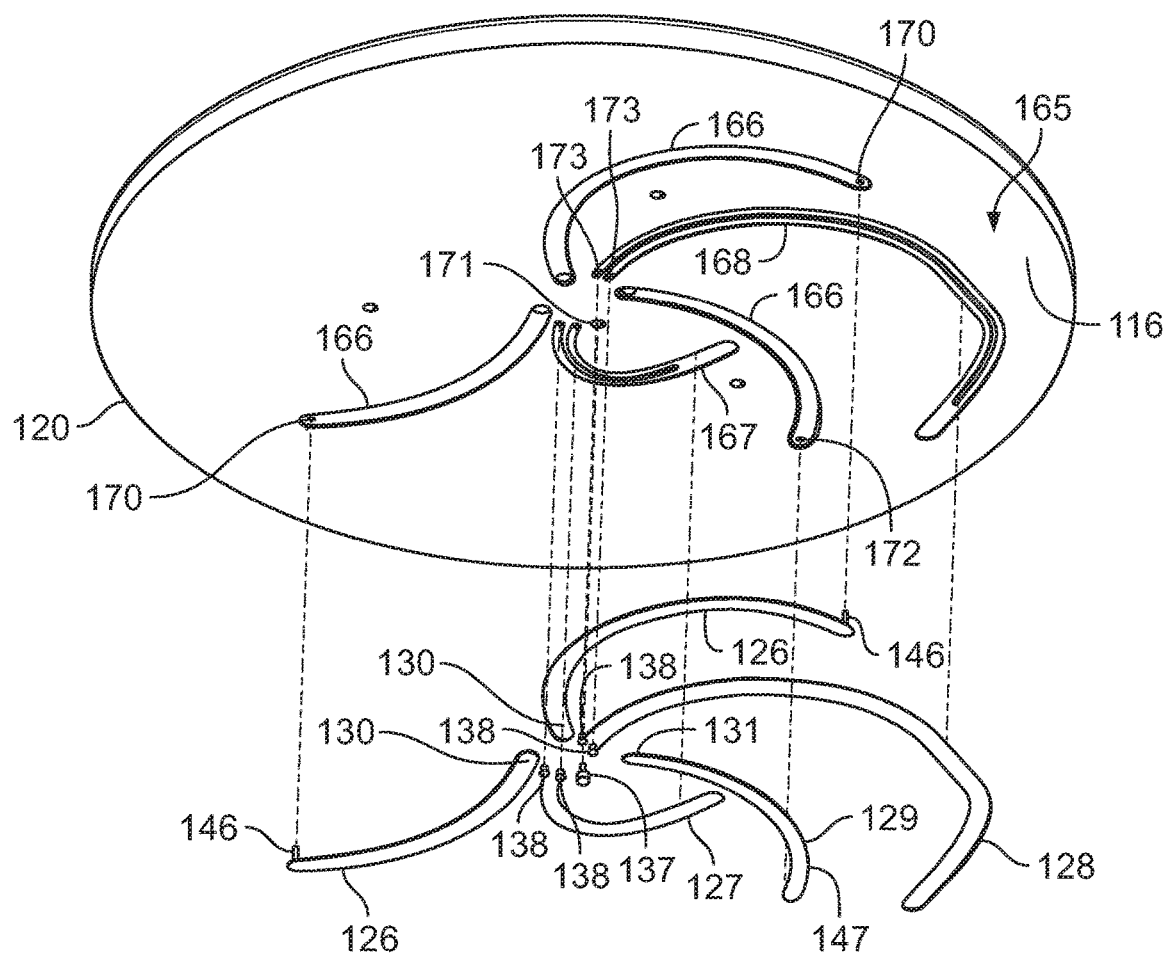
FIG. 9 illustrates a bottom exploded perspective view of the disc of FIG. 8 together with interconnects and thermocouple(s).

Disc 120 is configured with grooves 165 positioned on the bottom side 116 of disc 120 to receive interconnections 125. As best illustrated in the embodiments of FIGS. 8-9, grooves 165 include heating element interconnection grooves 166, inner thermocouple interconnection grooves 167, and outer thermocouple interconnection grooves 168. For purposes of this disclosure, as illustrated in FIGS. 2 and 9, interconnections 125 include heating element interconnections 126,129, inner heating element thermocouples 127, and outer heating element thermocouples 128. In some embodiments, the interconnections 125 may be embedded within or between the thermal conductive layers 140,145 and/or disc 120. For example, rather than forming grooves 165 in the bottom side 116 of disc 120, grooves 165 may instead be disposed in the top side of thermal conductive layer 145 to receive the one or more heating elements.

Figure 10:
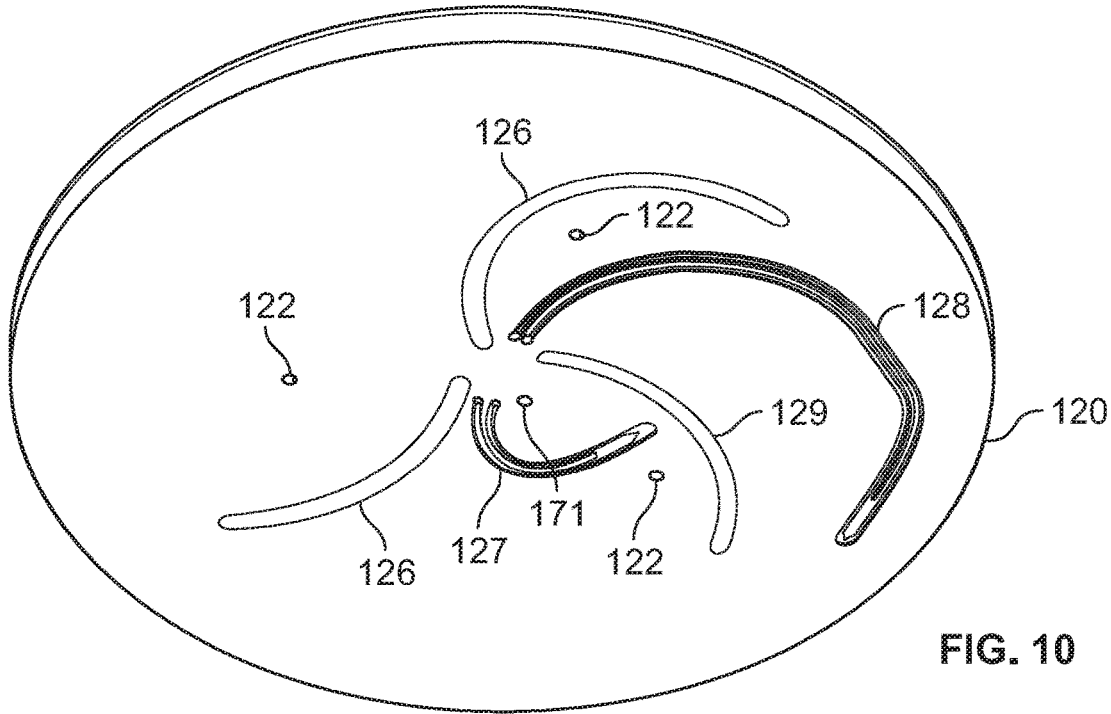
FIG. 10 illustrates a bottom perspective view of the disc of FIG. 9 after installation of the interconnects and thermocouple(s).

As shown in FIG. 10, heating element interconnections 126,129 are positioned in or received by respective interconnection grooves 166, inner heating element thermocouples 127 are positioned in or received by interconnection grooves 167, and outer heating element thermocouples 128 are positioned in or received by interconnection grooves 168. Grooves 165 are generally arcuate and arranged somewhat radially in a common plane. Interconnection pass-through holes 170,171,172,173 allow communication of power to the one or more heating elements 110 and sensor signals from inner and outer thermocouples 127,128 to pass through the disc 120 to or from the top side 115 for communication through conductors, such as any electrodes and thermocouple extension wires lying inside riser post and ultimately through a feedthrough (not shown).

Specifically, posts 146 of respective heating element interconnections 126 are inserted in or received by respective passthrough holes 170 to communicate power to outer heating element 112. One post 146 conveys electricity to outer heating element 112, and the other post 146 returns electricity from an opposite end of outer heating element 112 back to a feedthrough (not shown) to complete the circuit.

Figure 12:
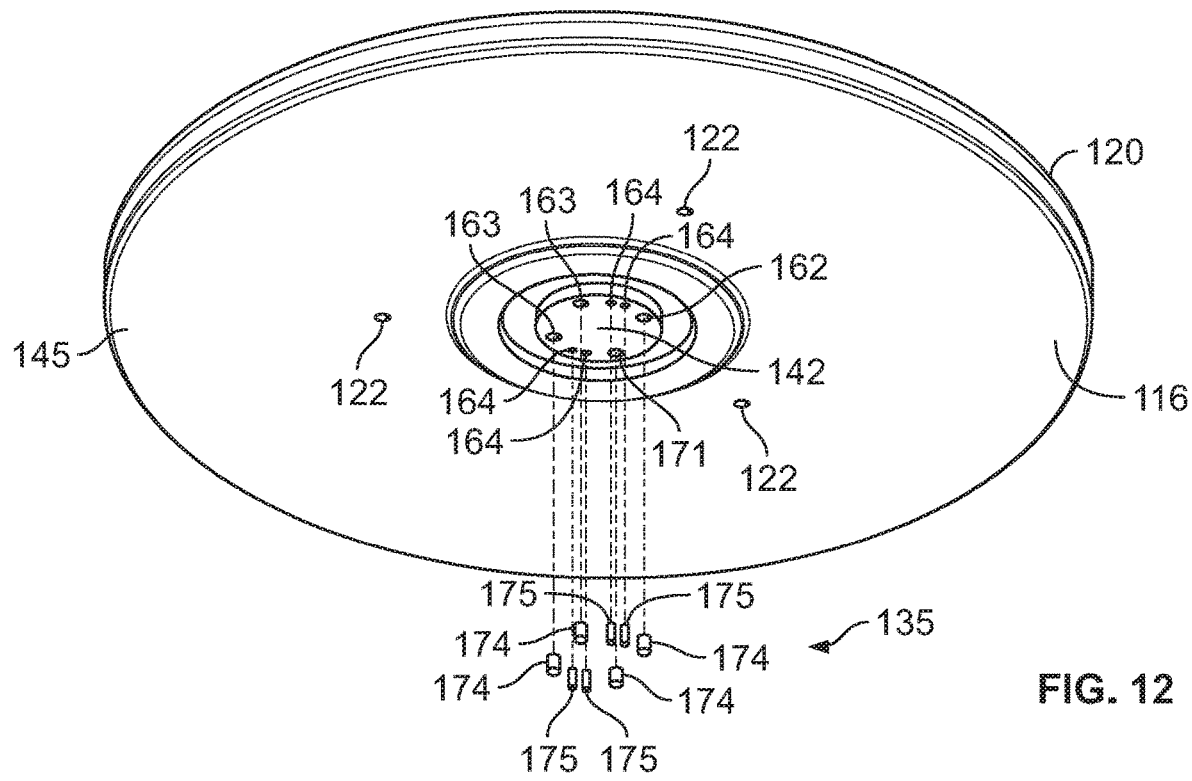
FIG. 12 illustrates a bottom exploded perspective view of the disc of FIGS. 8-11 after compacting the thermally conductive powder onto the bottom side of the disc, after machining, and after sintering to form the completed disc assembly. Also shown are respective thermocouple sockets and heating element sockets, which can be installed before or after sintering the disc.

One of the heating element interconnections 126 receives electricity at its inner end interface 130 and conveys electricity to its post 146. The other of the heating element interconnections 126 receives electricity from its post 146 and conveys electricity to its inner end interface 130. As shown in FIGS. 9 and 12, inner end interface 130 receives electricity conveyed to it from a respective socket 174 that is inserted into passthrough hole 163 positioned on inner hub 142 of disc 120. Of course, electricity may flow in the opposite direction.

Similarly, post 147 (not shown) of heating element interconnection 129 is inserted in or received by passthrough hole 172 to communicate power to inner heating element 111. Post 147 conveys electricity to inner heating element 111, and terminal 137 returns electricity from an opposite end of inner heating element 111 back to a feedthrough (not shown) to complete the circuit.

Heating element interconnection 129 receives electricity at its inner end interface 131 and conveys electricity to its post 147. As shown in FIGS. 9 and 12, inner end interface 131 receives electricity conveyed to it from a socket 174 that is inserted into passthrough hole 162 positioned on inner hub 142 of disc 120. Terminal 137 conveys electricity from the opposite end of inner heating element 111 to a socket 174 that is inserted in passthrough hole 171 positioned on inner hub 142 of disc 120. Of course, electricity may flow in the opposite direction.

Inner and outer thermocouples 127,128 produces a temperature-proportional millivolt signal and communicates that signal via terminals 138 that are connected to respective sockets 175 inserted into respective passthrough holes 164.

The composition and method of fabricating the heating element interconnections 126,129 and the sockets 135 may be similar to that of the one or more heating elements 110 so as to include the benefit of low change in resistance over the operating temperature range in these components. Low change in electrical resistance (i.e., electrical resistance is relatively insensitive to temperature change) as disclosed herein minimizes heat contribution to thermal non-uniformity. Consequently, the heating element interconnections 126,129 and the sockets 135 may be doped as described herein for the one or more heating elements 110. In some embodiments, it may also be acceptable for heating element interconnections 126,129 and the sockets 135 to be undoped, but in such situations, the undoped heating element interconnections 126,129 and the sockets 135 must have sufficiently low electrical resistance at any temperature compared to the one or more heating elements 110. This can be achieved by controlling the geometry, for example, of the heating element interconnections 126,129 and the sockets 135 so that the electrical resistance is sufficiently small. In some embodiments, the composition of heating element interconnections 126,129 and the sockets 135 comprising one or more refractory hard metals as disclosed herein may not need doping or at least only to the extent that is needed for the resistive part of the respective component.

Figure 11:
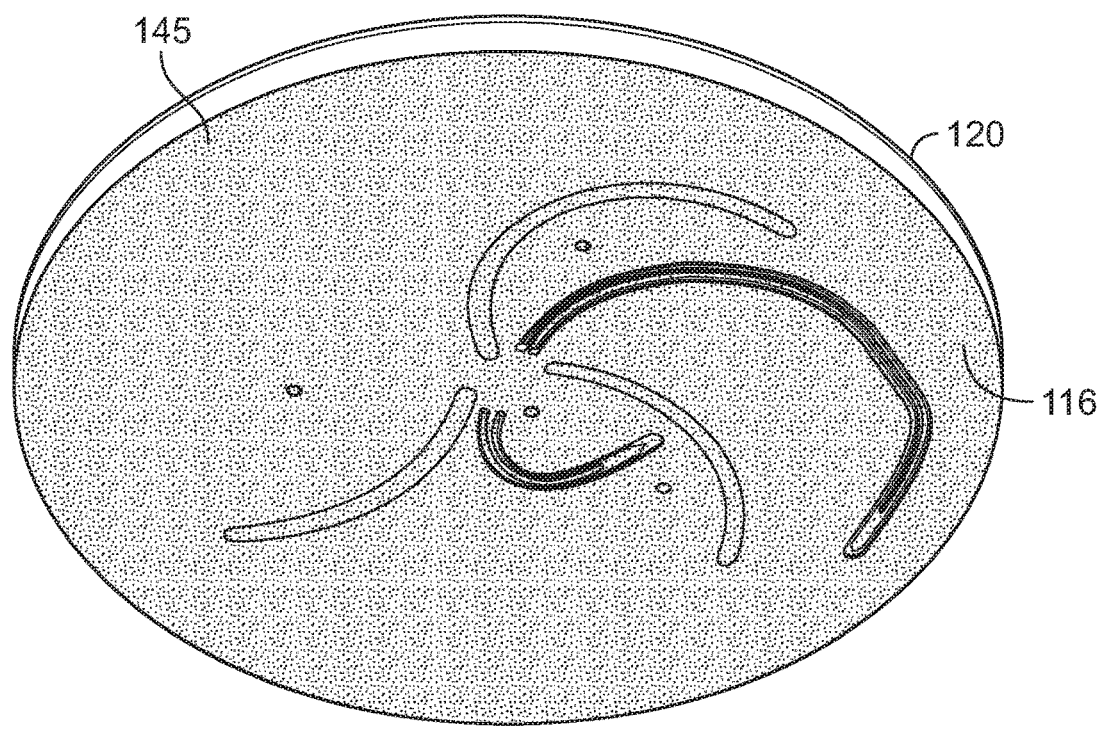
FIG. 11 illustrates a bottom perspective view of the disc of FIGS. 8-10 after deposition of thermally conductive powder on the bottom side of the disc.
Figure 13:
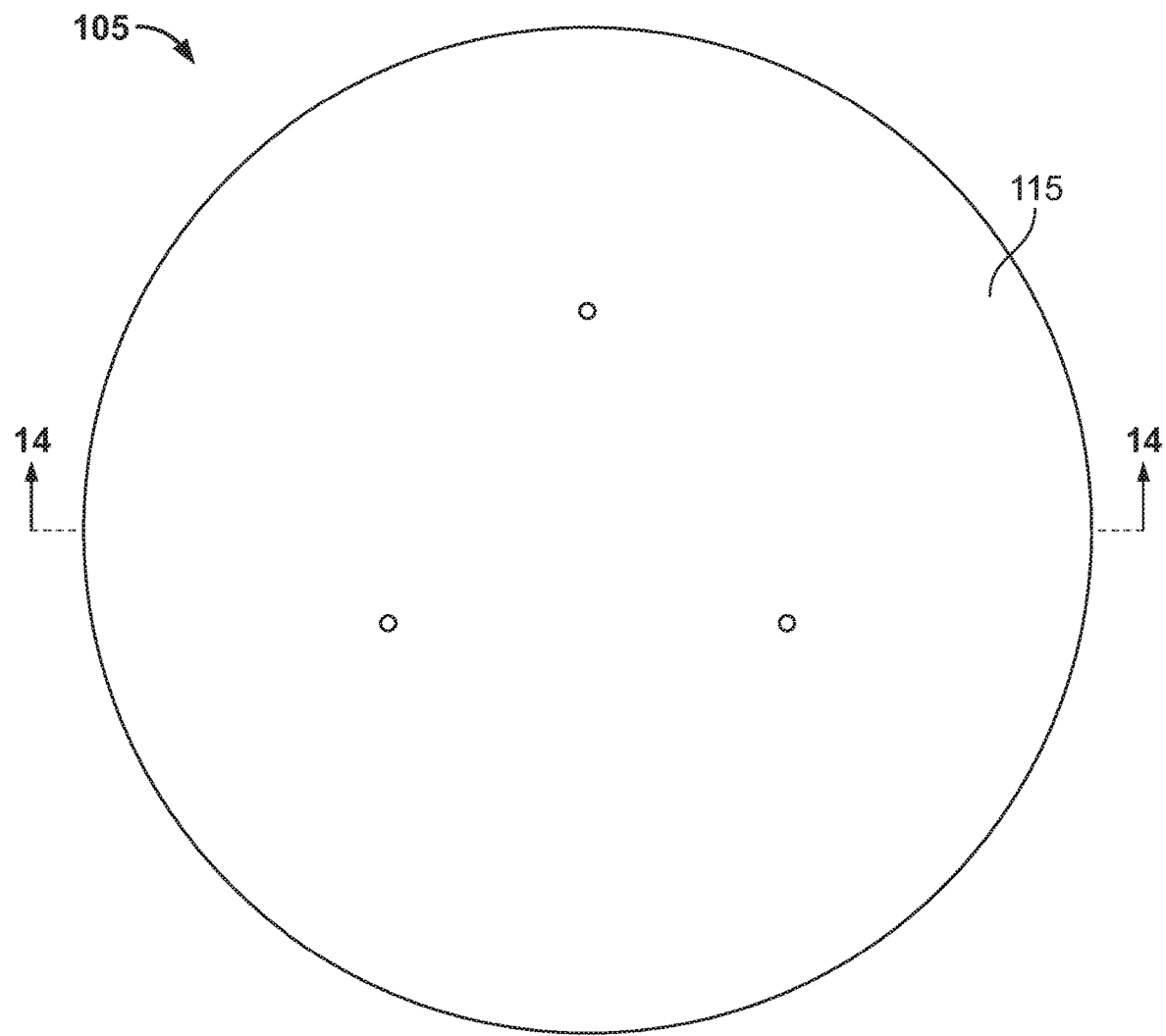
FIG. 13 illustrates a top plan view of the disc assembly of FIG. 12.
Figure 14:
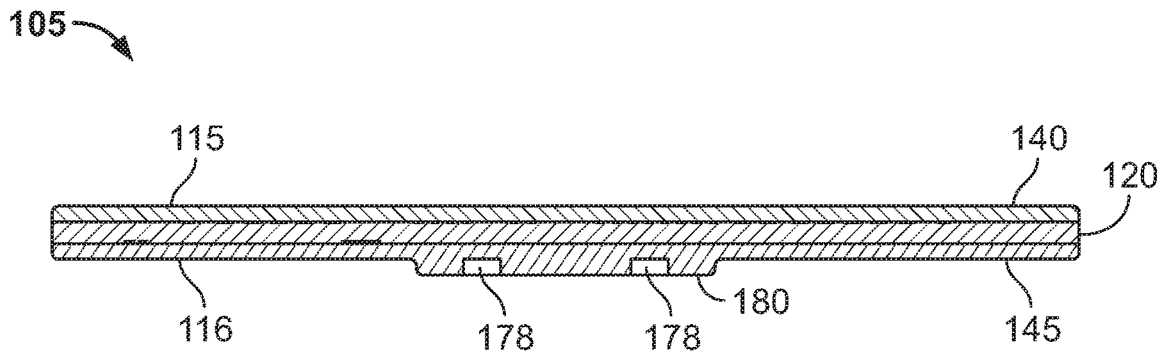
FIG. 14 is a cross section view of the disc assembly of FIG. 13 taken along line 14-14.
Figure 15:
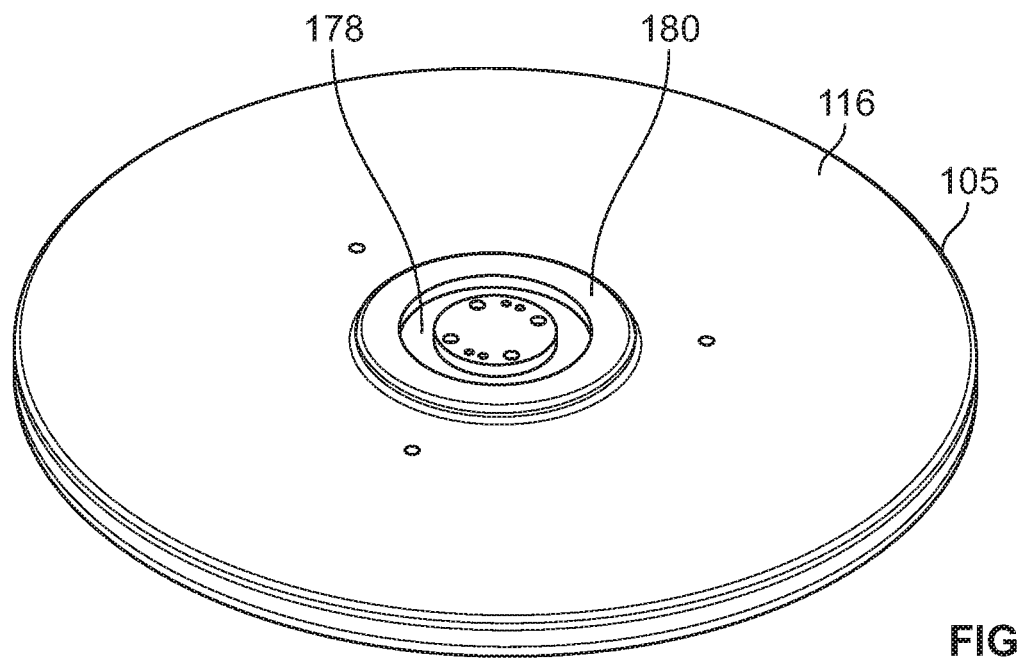
FIG. 15 is a bottom perspective view of the disc assembly of FIG. 13.

As shown in FIG. 11, thermal conductive layer 145 is initially disposed on the bottom side 116 of disc 120 in the form of an aluminum nitride powder. The powder is consolidated with binders under pressure to form a machinable surface. As shown in FIG. 12, the bottom side 116 has been pressed and machined to form completed thermal conductive layer 145. Sockets 135 include heating element sockets 175 and thermocouple sockets 176. FIGS. 13-15 show the completed disc assembly 105. Bottom side 116 of disc assembly 105 includes annular groove 178 formed in annular protrusion 180 to receive flange 182 of riser post 150. At this point, holes 122 may be enlarged to their final diameter for purposes of providing access for a wafer lifting mechanism. Sockets 135 can be inserted in disc 120 either before or after sintering the disc 120/disc assembly 105.

Figure 16:
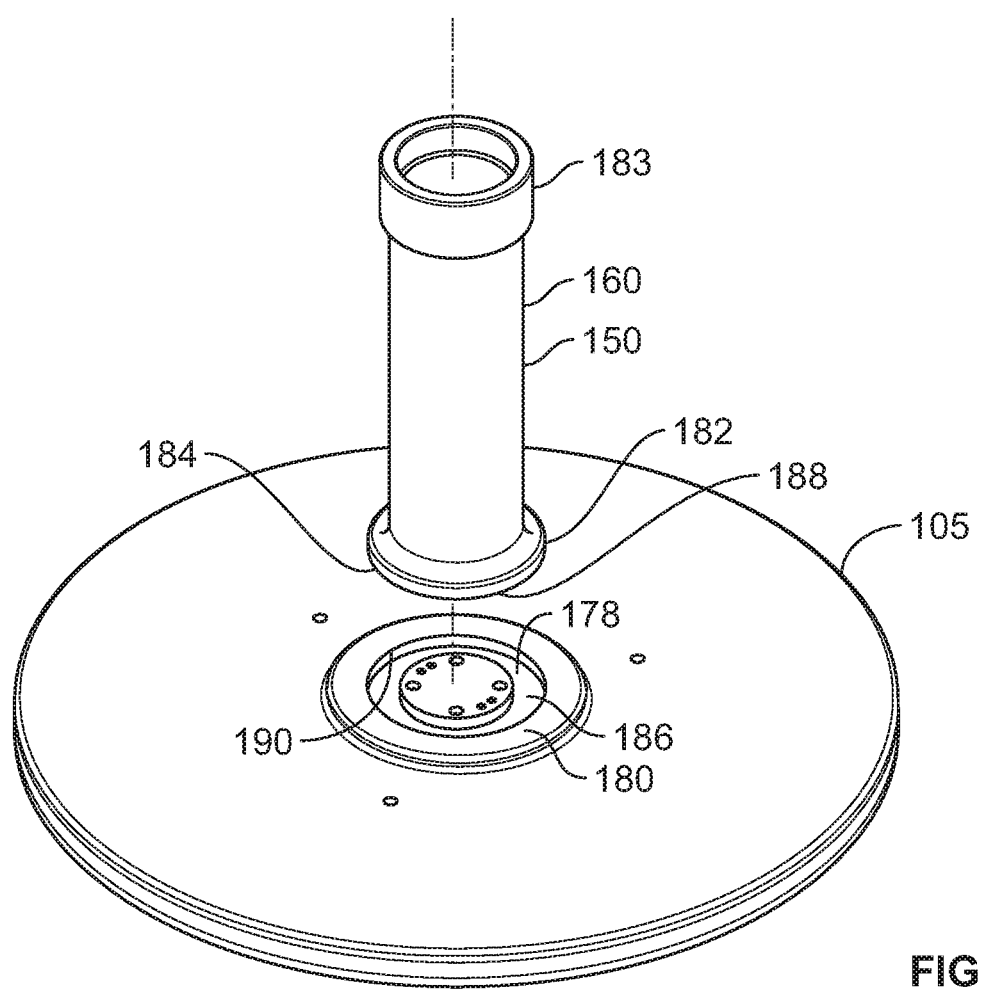
FIG. 16 is a bottom exploded perspective view of the disc assembly of FIG. 15 together with the riser post.
Figure 17:
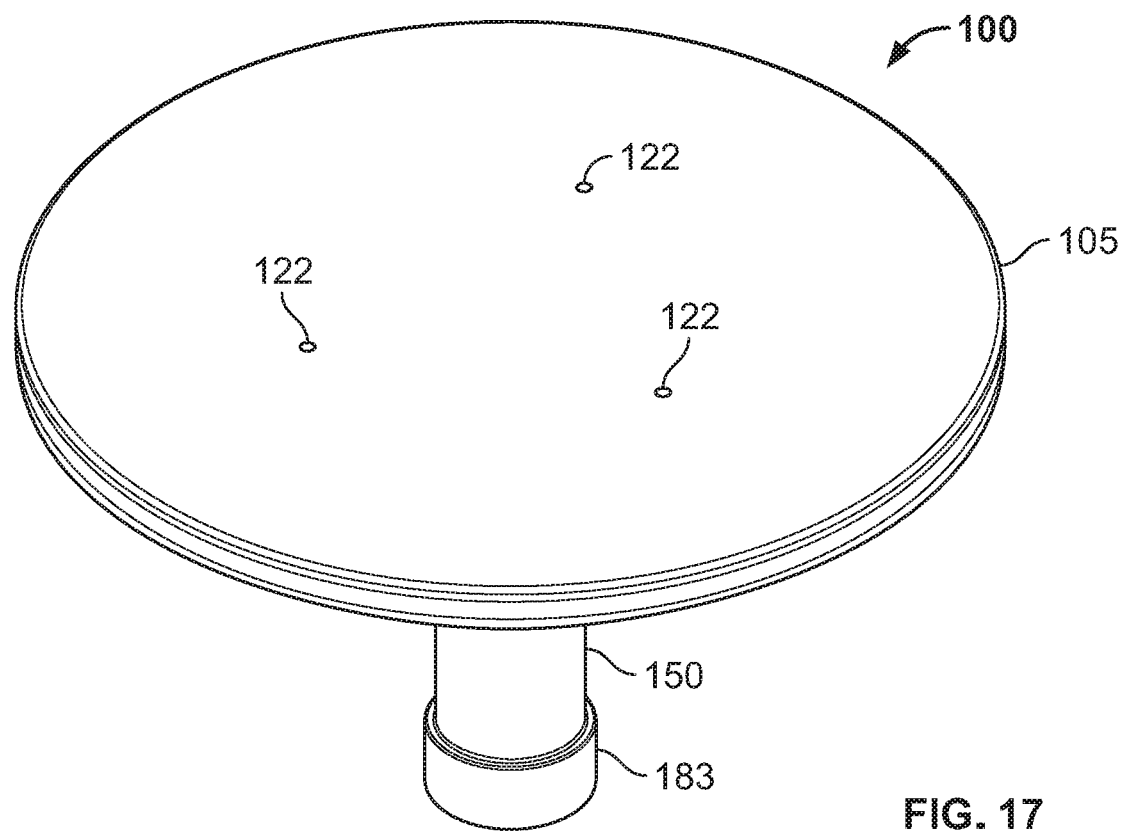
FIGS. 17 and 18 are respective top and bottom perspective views of the disc assembly of FIG. 15 together with the riser post of FIG. 16 shown in the installed position to form an electric heater apparatus with joined riser post.
Figure 18:
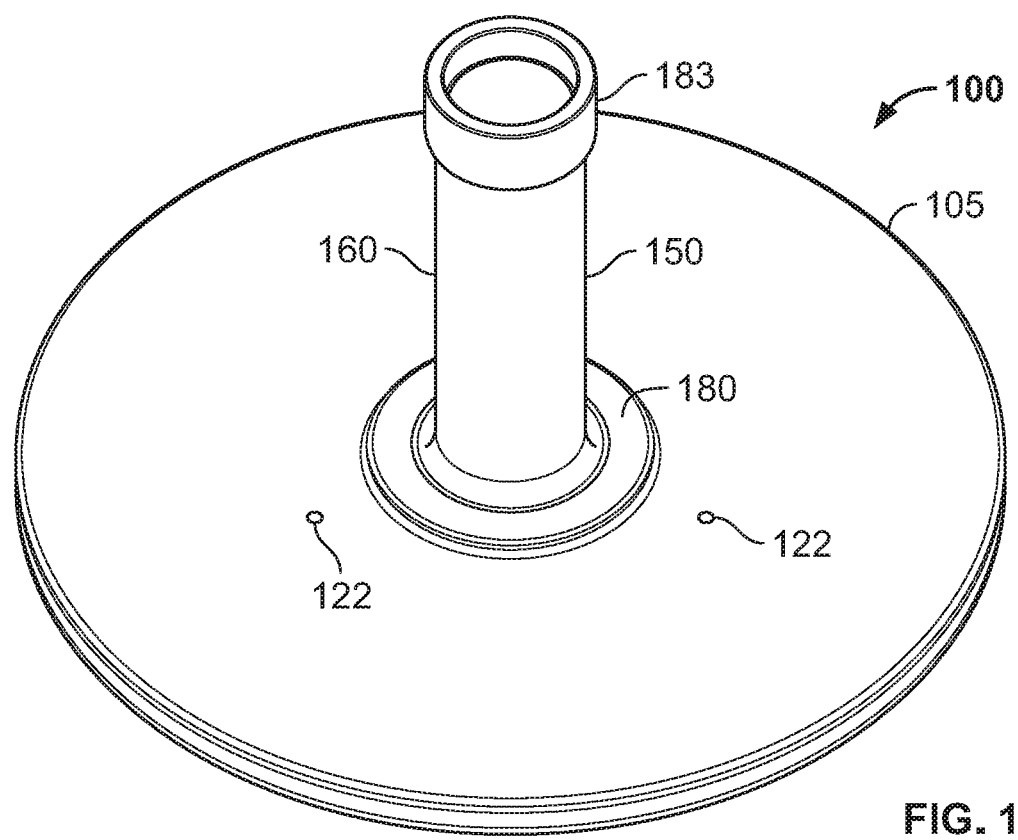

FIG. 16 shows disc assembly 105 before installation of riser post 150, and FIGS. 17-18 show disc assembly 105 after installation of riser post 150. Riser post 150 includes tubular extension portion 160 with flange 182 on one end (the top end) and annular protrusion 183 on the opposite end (the bottom end). Top surface 184 of flange 182 is configured to mate with bottom wall 186 of annular groove 178. Likewise, outer wall 188 of flange 182 is configured to mate with outer wall 190 of annular groove 178, and inner wall 192 of flange 182 is configured to mate with inner wall 194 of annular groove 178. Annular protrusion 183 is configured to engage a feedthrough (not shown) or other structure to transition to atmospheric conditions outside the wafer processing chamber.

Riser post 150 may be joined to disc assembly 105 using any applicable joining method to create a strong joint that has the capability of also being a helium tight seal. For example, diffusion bonding, metalized brazing, mechanical joint with high temperature seal, glass or glass ceramic joining techniques or other techniques may be used depending on process requirements. One suitable joining method is disclosed in U.S. Pat. No. 5,096,863 entitled, "Diffusion-Bonded Assembly of AlN Ceramic Bodies and Heat Dissipation Member Constituted Thereby," which is incorporated by reference herein in its entirety. The joining process taught in this patent creates a helium-tight seal between riser post 150 and disc assembly 105.

It should be noted that any geometry or construction of the electric heater apparatus is possible that is consistent with the principles disclosed herein. For example, some end-users may require a construction that includes a ground plane or an electrostatic chuck electrode embedded within the disc assembly 105. Such additional features may easily be incorporated without departing from the teachings herein. In addition, different electrical wiring schemes may be deployed to accommodate multiple heating elements and/or heating zones while minimizing the number of passthrough connections. In addition, disc assembly 105 may include more than the number of layers described above with interconnections that communicate signals (i.e, power, sensor, etc.) between components on different layers.

Figure 22:
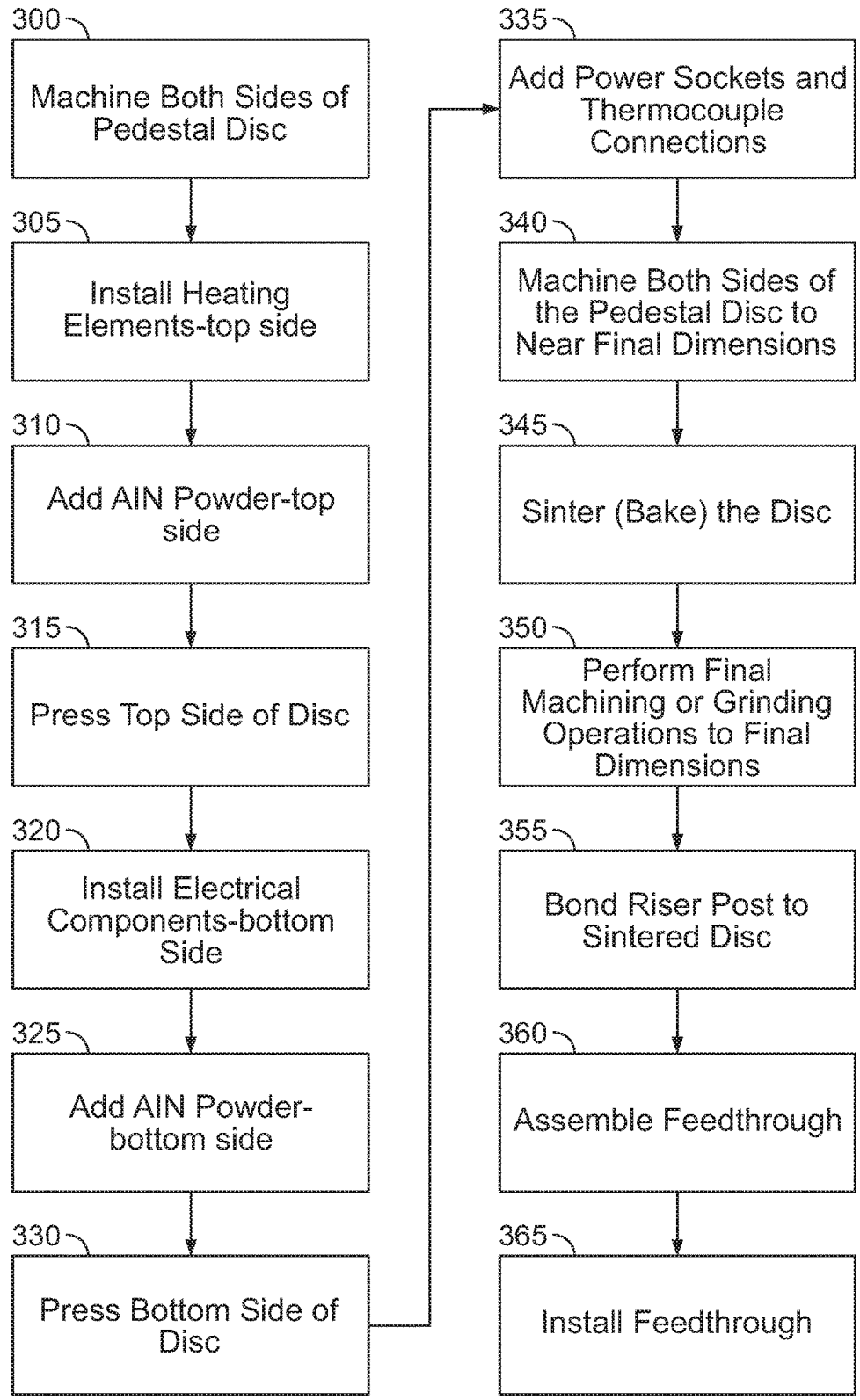
FIG. 22 is a flow schematic illustrating a method for fabricating an embodiment of the electric heater of the instant disclosure.

Turning to FIG. 22, various steps for manufacturing one embodiment of electric heater apparatus 100 is shown. For example, at step 300, starting with "green" disc 120 made from a thermally conductive and electrically insulative material, such as aluminum nitride, formed by consolidated powders with binders under sufficiently high pressure in a mold and of a desired diameter and initial thickness, grooves 155 are created on the top side 115 of disc 120 to receive the one or more heating elements 110, and grooves 165 are created on the bottom side 116 of disc 120 to receive interconnections 125. In other embodiments, grooves 165 may be created at a different time than grooves 155. To fabricate grooves 155,165, a masking film may be applied to the respective top side 115/bottom side 116 and a laser engraving technique may be deployed. Other, similar techniques may be used to fabricate grooves 155,165 without departing from the teachings of the instant disclosure. For example, grooves 155,165 may be formed in the green disc 120 when disc 120 is initially pressed and formed. Alternatively, grooves 155,165 may be machined into disc 120 after initial formation of disc 120.

Holes 122 may be created at this point to enable/ensure clocking/indexing of the disc 120 after the disc surfaces are covered with aluminum nitride powder. At step 305, the one or more heating elements 110 are disposed in grooves 155. To do that, at least one of: (1) a highly loaded paint comprising one or more refractory hard metals, such as molybdenum, tungsten, and/or tantalum, etc., (2) a pre-cut pattern from a polymer sheet comprising one or more highly loaded refractory metals, such as molybdenum, tungsten, and/or tantalum, etc., or (3) a highly loaded powder of refractory hard metals, such as molybdenum, tungsten, and tantalum, etc., all of the foregoing comprising a composition/concentration as disclosed herein or as would naturally flow from the teachings disclosed herein as appreciated by one of ordinary skill, is applied or laid in (as applicable) to fill in the grooves 155. At step 310, a thermally conductive powder, such as aluminum nitride powder, is applied to the top side 115 of disc 120. At step 315, the powder is consolidated with binders under pressure to form a machinable surface. At step 320, interconnections 125 are installed in grooves 165, and a highly loaded one of a powder, a paint, or a pre-cut pattern from a polymer sheet as disclosed above, each comprising one or more refractory hard metals, such as molybdenum, tungsten, and/or tantalum, etc. of the composition/concentration disclosed herein, is applied or laid in to fill in the grooves 165. At step 325, a thermally conductive powder, such as aluminum nitride powder, is applied to the bottom side 116 of disc 120. At step 330, the powder is consolidated with binders under pressure to form a machinable surface. At step 335, power and thermocouple sockets 135 are installed in respective through holes in the aluminum nitride powder on the bottom side 116 of disc 120. At step 340, both sides of disc 120 are machined to near final dimensions to form disc assembly 105. At step 345, disc assembly 105 is subject to binder burn-off and sintering in a nitrogen atmosphere under controlled heating to create a small amount of residual carbon. A part of this carbon is incorporated in the molybdenum powder which shrinks and sinters to create a dense one or more heating elements 110 within the aluminum nitride matrix. The remainder of the carbon reacts with $Al_2O_3$ to form aluminum nitride and carbon monoxide. At high temperature, typically in the range of about 1600° C. to about 1850° C., due to interactions between aluminum nitride, molybdenum, carbon and the sintering aid of alumina-yttria, in a nitrogen atmosphere, the composition of the one or more heating elements 110 is allowed to approach chemical equilibrium resulting in desired compositions of the one or more heating elements 110.

At step 350, final machining and/or grinding operations are performed on disc assembly 105 to achieve final dimensional form. At step 355, riser post 150 is joined to disc assembly 105 using any applicable joining method as disclosed herein. At step 360, a feedthrough may be assembled (if made of separate components), and at step 365, the feedthrough may be installed onto riser post 150.

One of ordinary skill will appreciate that various additive manufacturing methods may be adapted to fabricate disc assembly 105 and/or electric heater apparatus 100. As described below for electric heater apparatus 400, a suitable additive manufacturing process may include a process called Laminated Object Manufacturing developed by Helysis Inc., which is incorporated by reference herein in its entirety, for creating 3D objects by stacking sheets of laser cut paper fed by a roll to roll process.

Figure 23:
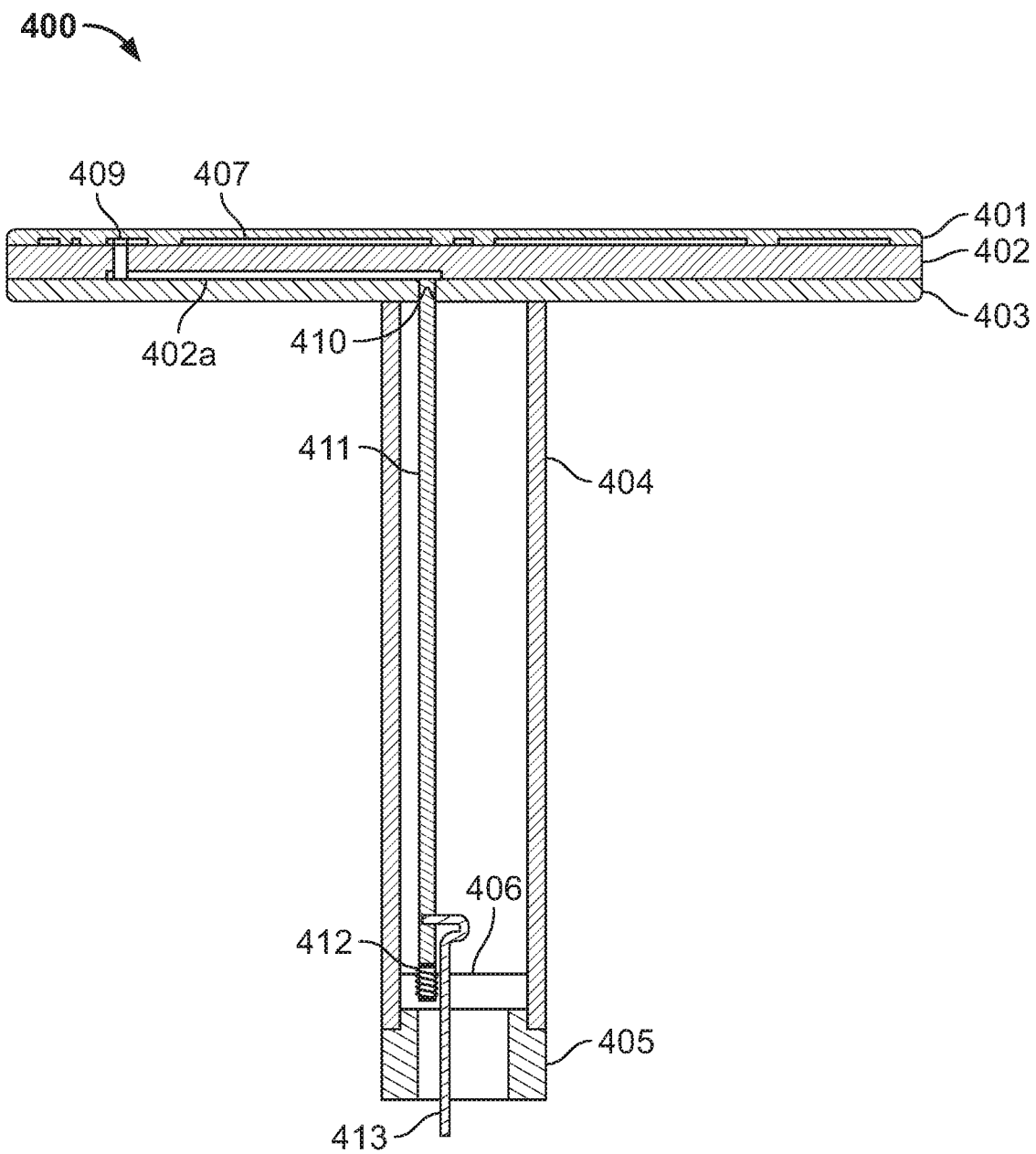
FIG. 23 is a cross sectional view of another embodiment of an electric heater apparatus of the instant disclosure.

Turning now to FIG. 23, there is shown another embodiment of an electric heater apparatus 400 of the instant disclosure. In this embodiment, disc assembly 420 includes aluminum nitride layers 401,402,403 with embedded heating element 407, vias 409 and power distribution layer 402a, shaft 404, and feedthrough 406, metal chamber mounting flange 405, heating element/electrode components 411,412, 413, and electrode entry point 410.

A heating element/electrode system, shown conceptually as components 411,412,413, is used to provide current to heating element 407 at entry point 410. Rigid pin 411 is an electrically conductive metal that is not limited to molybdenum or tungsten since it is not bonded to the entry point 410. In some embodiments, a nickel alloy may be utilized as well. The interface between 410 and 411 create electrical contact feeding current. Upward force is applied by spring 412. A flexible conductor connects to outside system. It is sealed at feedthrough 406. This connection system may be used for heaters and thermocouple sensors. Only 1 set of components is shown for simplicity. This connection system allows for thermal extension of components at elevated temperatures. A metal chamber mounting flange 405, preferably made out of aluminum with sealing components and fasteners mounts pedestal to chamber wall or lifting stage.

In at least this embodiment, heating element 407 include doped molybdenum or molybdenum-containing carbides, or equivalent compounds of refractory hard metals such as tungsten or their alloys. The preferred doping of molybdenum involves carbon, aluminum, and possibly nitrogen, oxygen and yttrium.

The carbon dopant is generated or otherwise added to metallic powders associated with the electrically conductive heating element 407 during binder burn-out while sintering the disc assembly 420. During this process, the part is heated in the range of about 1600° C. to about 1850° C. in an inert or substantially inert atmosphere to pyrolyze the binders in such a way to produce the desired amount of residual carbon. The amount of carbon created by this process is kept below the oxygen content of aluminum nitride that is not associated with yttria so that the composition of the liquid phase of alumina and yttria is such that $Al_2O_3/Y_2O_3$ molar ratio in the sintered body is between 10:3 to 0.1:1. A part of this carbon is incorporated in the molybdenum powder which shrinks and sinters to create a dense heating element within the aluminum nitride matrix. The remainder of the carbon reacts with $Al_2O_3$ to form aluminum nitride and carbon monoxide. At high temperature, typically in the range of about 1600° C. to about 1850° C., due to interactions between aluminum nitride, molybdenum, carbon and the sintering aid of alumina-yttria (as described above for disc 120), in a nitrogen atmosphere, the composition of the heating element 407 is allowed to approach chemical equilibrium resulting in desired composition of the heating element 407. The other dopants such as aluminum, nitrogen, oxygen, and yttrium may get added simply by high temperature interactions between the conductive heating element constituents and the surrounding aluminum nitride matrix. The concentration of carbon, aluminum, nitrogen, oxygen, and yttrium can be allowed to vary within the following ranges:

Carbon: 0.1-50 at %
Aluminum: 0.1-20 at %
Nitrogen: 0-20 at %
Oxygen: 0-5 at %
Yttrium 0-3 at %

It should be noted that SEM/EDS analysis may be insensitive to trace to small amounts of boron. Typically, if boron concentrations become greater than −10%, it may be detected if there is no interference from other elements in the spectral analysis. Since boron could be present on account of its use as boron nitride (or boron nitride in combination with aluminum nitride machinable ceramic) to provide inert support during binder burn-off and/or sintering, it cannot be excluded from a possible composition. Therefore, in a manner described above for dopants like aluminum, nitrogen and oxygen, boron may get added during the high temperature interactions during sintering, but it may not get detected using traditional SEM/EDS analysis. Therefore, boron as a dopant generally in the range from 0 to the detection limit, which is about 10 at %, cannot be ruled out.

The compositions of the heating elements 407 involve non-metallic elements such as carbon, nitrogen and oxygen along with trace amounts of boron and those found in aluminum nitride ceramic, namely, aluminum, yttrium—all as determined by SEM/EDS analysis. Non-metallic elements may be added either by direct addition of precursors, such as organic binders that yield residual amount of carbon during their pyrolysis in the binder burn-off step, or by direct addition of particulate carbon, which would be incorporated only in the heating element forming either a solid solution of molybdenum and carbon or molybdenum carbide (either $Mo_2C$ or MoC). X-Ray diffraction analysis showed that the heating element contains a mixture of molybdenum and molybdenum carbide along with trace of unidentified phases due to insufficient number of peaks. In one case, molybdenum to molybdenum carbide as $Mo_2C$, ratio was nearly 2:1.

Since parts are fired in a nitrogen atmosphere with a liquid forming oxide sintering phase ($A2O3-Y_2O_3$), the composition of the heating elements 407 may include trace to small amounts of aluminum, yttrium and oxygen. Since it is well-known that addition of small dopants can affect electrical properties of metals and ceramics (a compound of metal and a non-metal), presence of trace to small amounts of elements in the heating element/electrode compositions must be considered.

The heating element 407 as described provides several highly desirable characteristics, including: (1) an ability to withstand thermal stresses (i.e., a coefficient of thermal expansion sufficiently close to that of the ceramic matrix of the heater pedestal disc assembly 420); (2) chemical compatibility (i.e., inertness) with respect to the ceramic matrix; (3) an ability to be co-fired with the ceramic matrix; and, (4) of particular note, an improved stability in electrical resistivity as a function of temperature, particularly at high operating temperatures. In fact, the heating element 407 as described is observed to have relatively low change in electrical resistivity (i.e., the electrical resistance is relatively insensitive to temperature change) in the desired operating range of about ambient temperature to about 850° C., due to a relatively low coefficient of electrical resistivity measured at approximately 0.001 (1/K) from about ambient temperature to about 850° C. compared to pure molybdenum, which has a coefficient of electrical resistivity of 0.005 (1/K) over the same temperatures. In one embodiment, as shown in FIG. 28, the electrical resistance ranged from about 4.18 ohm to about 4.28 ohm over a temperatures that ranged from about 300° C. to about 600° C.

The multilayer structure of the electric heater apparatuses as disclosed herein are also leak tight when mounted in a vacuum wafer processing chamber and provides a scalable design that can accommodate multiple zones, thus presenting a solution capable of a single heating zone or multiple heating zones for better temperature uniformity. The construction also allows for the addition of one or more thermocouples, for example, temperature sensors. Thermocouples were added between layers 402 and 403 and survived the ceramic manufacturing process.

In addition, the aforementioned concentration of carbon and aluminum, and possibly oxygen, involved in the doping of molybdenum yields unexpected discovery of reduced sensitivity of electrical resistance to temperature that allowed greater ease for temperature control, chemical compatibility at high temperatures, and compatibility with the aluminum nitride substrate during co-firing/sintering of the assembly.

In at least this embodiment disclosed herein, electric heater apparatus 400 can be constructed according to the following steps:
 a. Prepare a green body (i.e., a self-supporting body formed by consolidating ceramic powders with binders under sufficiently high pressure in a mold) comprising aluminum nitride. The green body is then machined to create a disc-like substrate on which heating element 407 can be printed and/or positioned.
 b. Using any one of several known paint or paste making techniques, electrically conductive heating element compositions comprising molybdenum powder, organic binders, and solvents are prepared. Alternatively, a highly loaded one of a powder, a paint, or a pre-cut pattern from a polymer sheet as disclosed above for electric heater apparatus 100, each comprising one or more refractory hard metals, such as molybdenum, tungsten, and/or tantalum, etc. of the composition/concentration disclosed herein, may be prepared.
 c. A masking film is then applied to one of the surfaces of the green body disc and a laser engraving technique is used to create a well-defined pattern comprising a shallow trench of required depth, width and length.
 d. Molybdenum paint is then applied to fill the trenches uniformly so that the molybdenum surface and the aluminum nitride surface are at the same level with respect to the baseline surface. Alternatively, the highly loaded one of a powder, a paint, or a pre-cut pattern from a polymer sheet as disclosed above, each comprising one or more refractory hard metals, such as molybdenum, tungsten, and/or tantalum, etc. of the composition/concentration disclosed herein, is applied or laid in to fill in the trenches. Vias 409 are then filled to create power leads connecting to the opposite surface.
 e. The mask is removed and the vias 409 as well as the pattern of the heating element 407 are checked for thickness uniformity and repaired if necessary.
 f. Successive powder pressing in a die followed by machining is then used to encapsulate or embed the conducting pattern of the heating element in a multi-layered disc assembly 420 structure as shown in FIG. 23.
 g. Alternatively, an additive manufacturing process may be adapted to encapsulate or embed the conducting pattern. A suitable additive manufacturing process that may be adapted for this purpose may include a process called Laminated Object Manufacturing developed by Helysis Inc., which is incorporated by reference herein in its entirety, for creating 3D objects by stacking sheets of laser cut paper fed by a roll to roll process. By utilizing the principles of that process, sheets of aluminum nitride may be produced by ceramic fabrication processes known in the art, such as pressing (as described herein), roll compaction, tape casting, spray deposition, etc. The surface of a sheet may be laser cut for passthrough connections and printed with conductive element paint. However, instead of adding powder on top of a sheet comprising a printed conductive element pattern and repressing it, the printed sheets can be stacked on top of each other and bonded initially by using solvent according to the teachings of U.S. Pat. No. 4,024,629 entitled, "Fabrication Techniques for Multi-Layer Ceramic Modules," which is incorporated by reference herein in its entirety. The assembly can be further consolidated by warm isostatic pressing, hydroforming or an equivalent forming technique. The Laminated Object Manufacturing process described above has been highly automated to create complex 3D structures, which suggests that the process for manufacturing the electric heater apparatus described herein may also be highly automated. It should be noted that the principles described here of creating two interconnected 3D structures: one that is electrically insulating but thermally conducting, and the other being electrically conducting, can be deployed using other additive manufacturing processes to create a matrix of aluminum nitride containing the internal structure described herein of electrical conductive patterns of heating elements, interconnects, sensors, etc. Such other additive manufacturing methods include: binder jetting, fused filament deposition, spray deposition, UV cured polymers containing highly loaded ceramic or metal powders as in stereolithography. After fabricating a green body of aluminum nitride containing an internal structure as described herein of electrically conductive heating elements, interconnects, power leads, thermocouples etc., the rest of the process steps described below are applicable.

h. The resultant disc assembly 420 is then subjected to binder burn-off and sintering in a nitrogen atmosphere. The binder burn-off is carried out in a nitrogen environment under controlled heating so that a small amount of residual carbon is created. The amount of carbon created by this process is kept below the oxygen content of aluminum nitride that is not associated with yttria so that the composition of the liquid phase of alumina and yttria is such that $Al_2O_3/Y_2O_3$ molar ratio in the sintered body is between 10:3 to 0.1:1. A part of this carbon is incorporated in the molybdenum powder which shrinks and sinters to create dense heating element/electrode within aluminum nitride matrix. As described earlier, the other dopants such as aluminum, nitrogen, oxygen, yttrium and possibly boron get added during sintering due to high temperature interactions between the heating element 407, vias 409 and surrounding aluminum nitride matrix containing alumina-yttria phase acting as sintering aid during sintering. The remainder of the carbon reacts with $Al_2O_3$ to form aluminum nitride and carbon monoxide. At high temperature, typically in the range of about 1600° C. to about 1850° C., due to interactions between aluminum nitride, molybdenum, carbon and the sintering aid of alumina-yttria, in a nitrogen atmosphere, the composition of the heating element 407 is allowed to approach chemical equilibrium resulting in desired composition of the heating element 407. This description covers the fabrication of a sintered aluminum nitride disc heater. It is then machined to the final dimensions needed for joining to hollow/tubular shaft 404 and for post-joining operations.

i. Prepare hollow/tubular shaft 404 from aluminum nitride using known processes suitable for fabricating articles from aluminum nitride, and machine to final form. More particularly, hollow/tubular shaft 404 is processed by following a standard process for sintering aluminum nitride ceramics, i.e., pressing powder into a tubular preform, machining the preform to create a green body of the desired shape and dimensions, then subjecting it to binder burn-off and sintering. The sintered part is then machined to final dimensions needed for creating the hollow/tubular shaft 404 that is ready for joining to the disc assembly 420.

j. The sintered hollow/tubular shaft 404 and the sintered aluminum nitride disc assembly 420 are attached to one another using any applicable joining method. For example, diffusion bonding, metalized brazing, mechanical joint with high temperature seal, glass or glass ceramic joining techniques or other techniques may be used depending on process requirements. One suitable joining method is disclosed in U.S. Pat. No. 5,096,863 entitled, "Diffusion-Bonded Assembly of AlN Ceramic Bodies and Heat Dissipation Member Constituted Thereby," which is incorporated by reference herein in its entirety.

k. The volume within tubular shaft 404 is purged with inert gas to prevent the components from oxidizing.

l. A power electrode system that is conceptually shown by components 411,412,413 is installed to feed current to the heating element 407 at entry point 410.

m. A flexible conductor connects to outside system and is sealed at feedthrough 406.

n. Although only one set of heating elements 407 and thermocouple sensors are shown for simplicity, in other embodiments, multiple heating elements and thermocouple sensors may be deployed.

o. This connection system allows for thermal extension of components at elevated temperatures.

This unique manufacturing method, which may include using an additive manufacturing process involving the use of granular compositions for most of the components, controlled binder burn-off process and sintering of the pedestal disc, produces a solution with unexpected results as disclosed herein.

Figure 24:
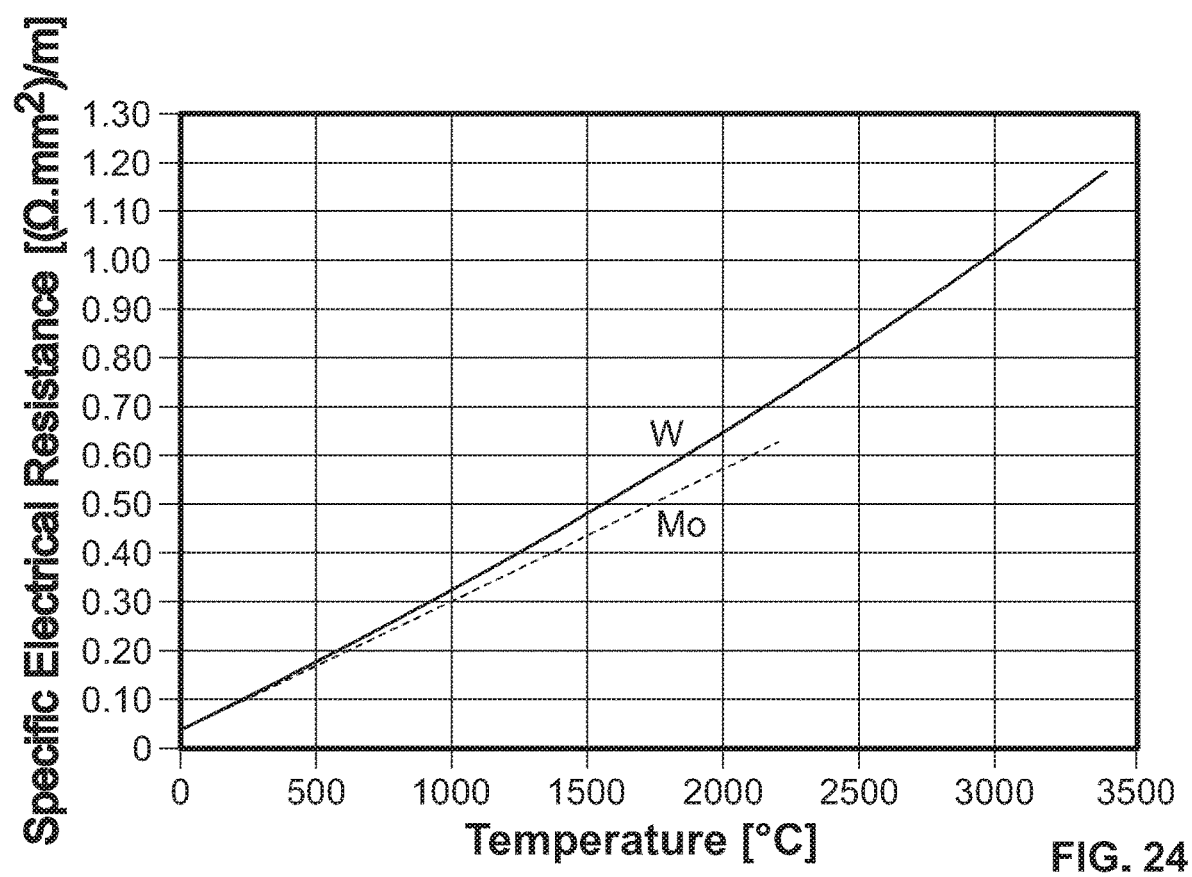
FIG. 24 is a representative graph illustrating electrical resistivity as a function of temperature of pure tungsten and pure molybdenum.

Turning now to FIG. 24, there is shown a graph illustrating electrical resistivity as a function of temperature of pure tungsten and pure molybdenum, which shows electrical resistivity increasing steadily over temperatures ranging from about 0° C. to about 3400° C. for tungsten, and from about 0° C. to about 2200° C. for molybdenum.

Figure 25:
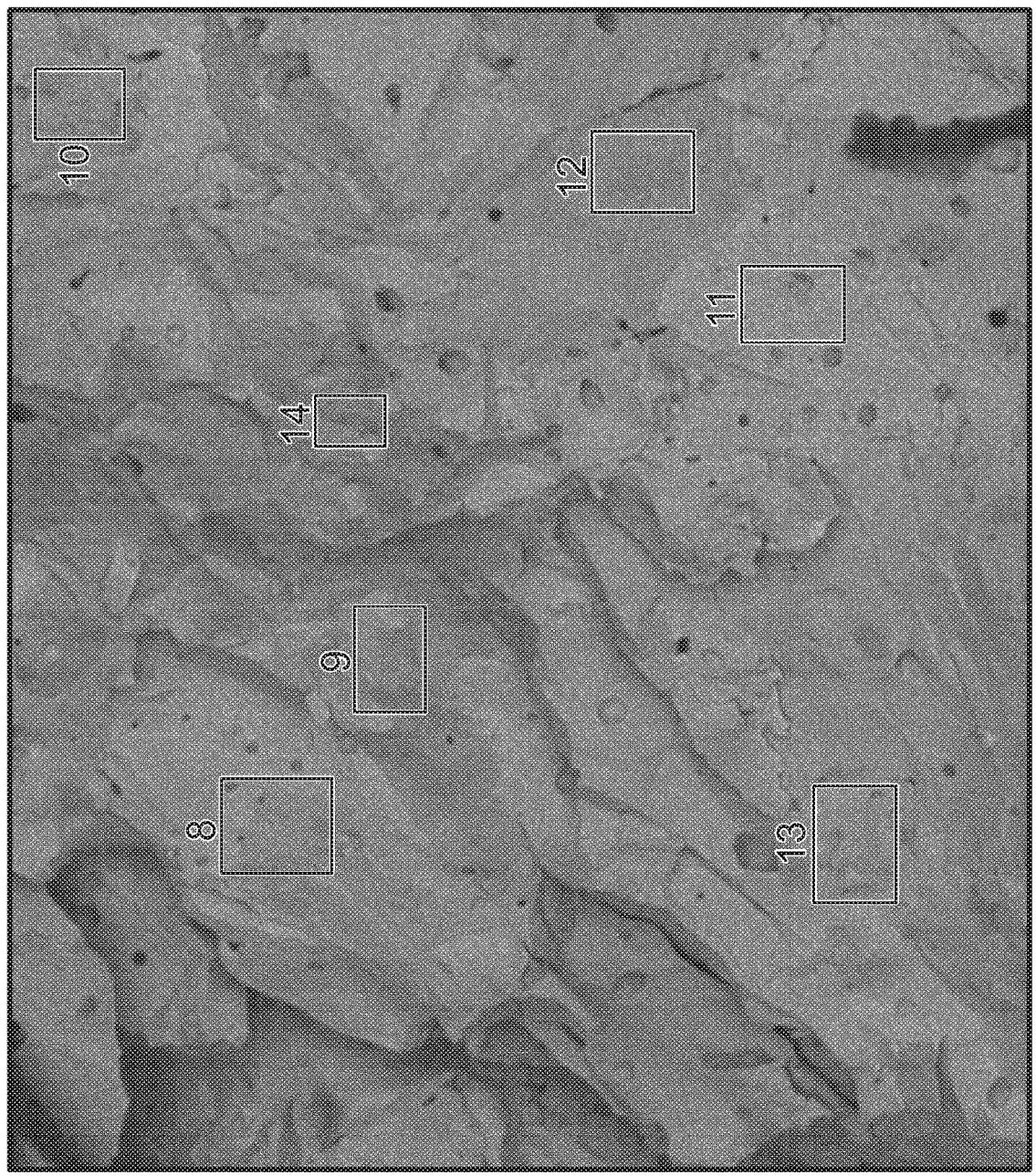
FIG. 25 is a SEM/EDS spectra analysis and FIG. 26 is a representative element concentration taken of spectrum 8 of FIG. 25 in the heating element cross section within the cross section of the aluminum nitride matrix in a sample disc assembly configured as disclosed herein.
Figure 26:
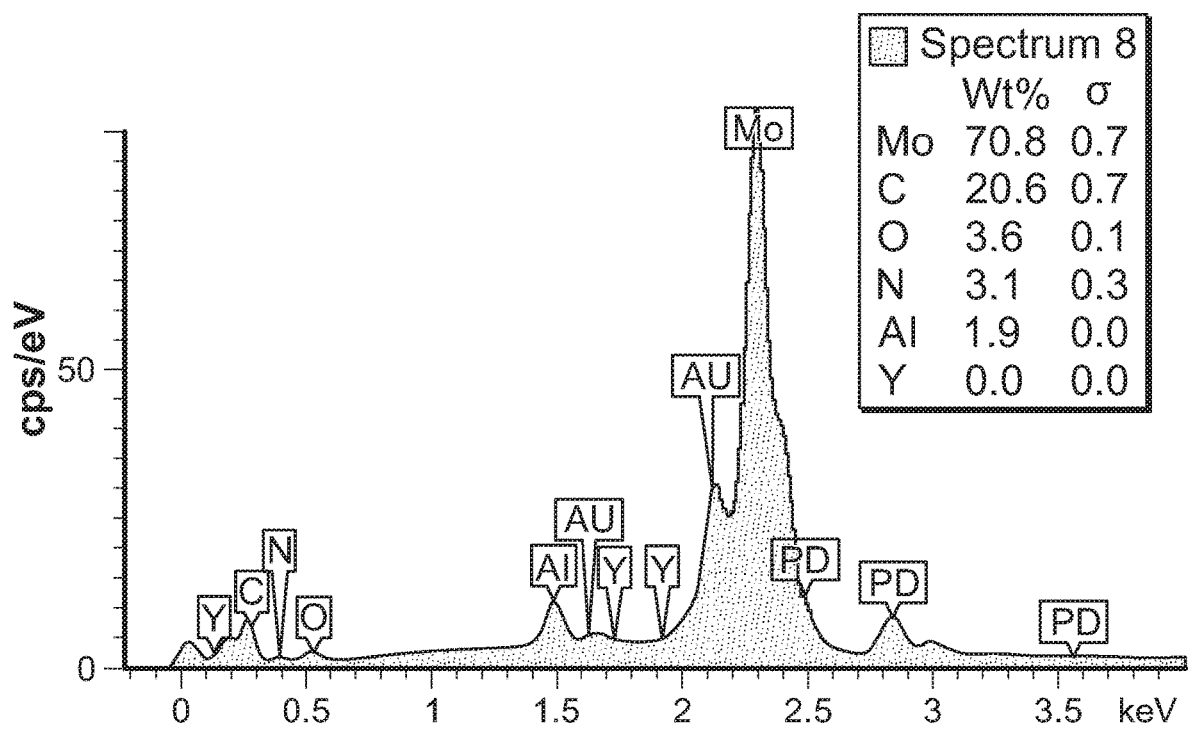

FIGS. 25 and 26 illustrate SEM/EDS spectra analysis and representative element concentrations in the vicinity of the heating element/electrode in a sample disc assembly configured as disclosed herein. Palladium and gold spectral lines are from a thin, conducting film coating of the specimen. In this specimen, the weight percent of molybdenum was 70.8%, carbon was 20.6%, oxygen was 3.6%, nitrogen was 3.1%, aluminum was 1.9%, and yttrium was 0.0%, as shown in FIG. 26.

Figure 27:
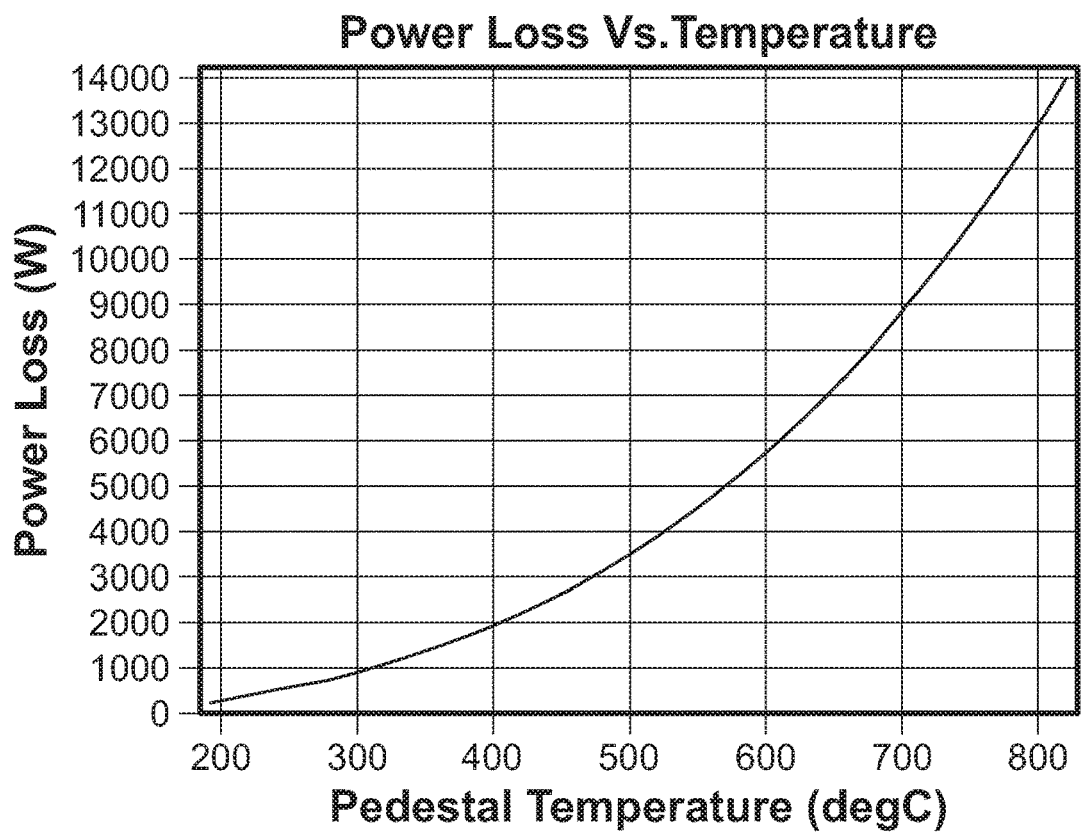
FIG. 27 is a power v. temperature plot according to a thermal simulation.

FIG. 27 shows a power v. temperature plot according to a thermal simulation. A plot of this type can be helpful for component sizing and selection of an appropriate control system. High temperature operation has high power requirements due to radiation heat loss. The Stefan-Boltzmann Law for radiation heat transfer shows non-linear increase (4th power) with temperature. The embodiments disclosed herein deliver high power for high temperature operation in the range of about 600° C. to about 800° C. due to high radiation heat loss, as illustrated in FIG. 25.

FIG. 28 illustrates resistance data captured from a representative heating element of the instant disclosure. The data shows resistance stabilizing at high temperatures, i.e., from about 500° C. to about 600° C., and to some extent from about 300° C. to about 500° C. Fluctuations are due to power variations and heating of conductors. Resistance is calculated from voltage and current readings.

The embodiments described herein are possible examples of implementations and are merely set forth for a clear understanding of the principles of the features described herein. Many variations and modifications may be made to the above-described embodiment(s) without substantially departing from the spirit and principles of the techniques, processes, devices, and systems described herein. All such modifications are intended to be included herein within the scope of this disclosure and protected by the following claims.

What is claimed is:

1. An electric heater apparatus for use in processing a semiconductor wafer in a wafer processing chamber, comprising:
   a first thermally conductive layer comprising an electrically insulating material, a top side, and a bottom side;
   one or more electrically conductive heating elements disposed in respective ones of one or more grooves arranged on the top side of the first thermally conductive layer, the one or more heating elements comprising one or more refractory hard metals doped with at least one of carbon, nitrogen, aluminum, yttrium, or oxygen, the doped one or more refractory hard metals comprising a temperature insensitive electrical resistance that varies from 4.18 ohm to 4.28 ohm over temperatures ranging from 300° C. to 850° C., wherein the one or more heating elements are independently controllable to provide one or more heating zones along the top side of the first thermally conductive layer; and
   a second thermally conductive layer disposed on the top side of the first thermally conductive layer over the one or more heating elements.

2. The electric heater apparatus of claim 1, wherein the first thermally conductive layer comprises a disc.

3. The electric heater apparatus of claim 1, wherein the first thermally conductive layer is sintered, and wherein the one or more heating elements initially comprise a highly loaded one of a powder, a paint, or a pre-cut pattern from a polymer sheet prior to sintering the first thermally conductive layer.

4. The electric heater apparatus of claim 1, wherein a concentration of carbon is allowed to vary from 0.1 at % to 50 at %, a concentration of aluminum is allowed to vary from 0.1 at % to 20 at %, a concentration of nitrogen is allowed to vary from 0 at % to 20 at %, a concentration of oxygen is allowed to vary from 0 at % to 5 at %, and a concentration of yttrium is allowed to vary from 0 at % to 3 at %.

5. The electric heater apparatus of claim 1, wherein the first thermally conducting layer comprises aluminum nitride.

6. The electric heater apparatus of claim 1, including a third thermally conductive layer disposed on the bottom side of the first thermally conductive layer, the third thermally conductive layer comprising a hub.

7. The electric heater apparatus of claim 6, wherein the second and third thermally conductive layers comprise aluminum nitride.

8. The electric heater apparatus of claim 6, including a sintered riser affixed to the hub.

9. The electric heater apparatus of claim 6, including a sintered riser bonded to the hub, and the bonded riser creates a helium tight seal with the hub.

10. The electric heater apparatus of claim 6, including one or more electrical interconnects disposed in respective ones of one or more channels arranged on the bottom side of the first thermally conductive layer.

11. The electric heater apparatus of claim 10, wherein the interconnects are configured to communicate electricity in a circuit from the hub to the one or more heating elements and from the one or more heating elements to the hub.

12. The electric heater apparatus of claim 10, wherein the interconnects are configured to communicate sensor data from one or more temperature sensors to the hub.

13. The electric heater apparatus of claim 12, wherein the one or more temperature sensors are disposed in respective ones of one or more channels arranged on the bottom side of the first thermally conductive layer and under the third thermally conductive layer.

14. The electric heater apparatus of claim 13, wherein the third thermally conductive layer is disposed over the one or more temperature sensors.

15. The electric heater apparatus of claim 1, wherein the one or more heating elements and the first thermally conductive layer comprise a functionally similar coefficient of thermal expansion to avoid deleterious cracks or fissures in the electric heater apparatus.

16. An electric heater apparatus for use in processing a semiconductor wafer in a wafer processing chamber, comprising:
   a sintered disc comprising a thermally conductive and electrically insulating material, a top side, and a bottom side;
   one or more electrically conductive heating elements disposed in respective ones of one or more grooves arranged on the top side of the disc, the one or more heating elements comprising one or more refractory hard metals doped with at least one of carbon, nitrogen, aluminum, yttrium, or oxygen, the doped one or more refractory hard metals comprising a temperature insensitive electrical resistance that varies from 4.18 ohm to 4.28 ohm over temperatures ranging from 300° C. to 850° C., wherein the one or more heating elements are independently controllable to provide one or more heating zones along the top side of the disc;
   a first thermally conductive layer disposed on the top side of the disc over the one or more heating elements;
   one or more interconnects disposed in respective ones of one or more channels arranged on the bottom side of the disc; and
   a second thermally conductive layer disposed on the bottom side of the disc over the one or more interconnects, the second thermally conductive layer comprising a hub,
   wherein the one or more electrically conductive heating elements are protected from chemical attack.

17. The electric heater apparatus of claim 16, wherein a concentration of carbon is allowed to vary from 0.1 at % to 50 at %, a concentration of aluminum is allowed to vary from 0.1 at % to 20 at %, a concentration of nitrogen is allowed to vary from 0 at % to 20 at %, and a concentration of oxygen is allowed to vary from 0 at % to 5 at %, and a concentration of yttrium is allowed to vary from 0 at % to 3 at %.

18. The electric heater apparatus of claim 16, wherein the thermally conducting and electrically insulating material is aluminum nitride.

19. The electric heater apparatus of claim 16, wherein the first and second thermally conductive layers comprise aluminum nitride.

20. The electric heater apparatus of claim 16, including a riser affixed to the hub.

21. The electric heater apparatus of claim 20, wherein the riser is bonded to the hub, and the bonded riser creates a helium tight seal with the hub.

22. The electric heater apparatus of claim 16, wherein the interconnects includes one or more electrical interconnects, and the electrical interconnects are configured to communicate electricity in a circuit from the hub to the one or more heating elements and from the one or more heating elements to the hub.

23. The electric heater apparatus of claim 16, including one or more temperature sensors disposed in the one or more channels.

24. The electric heater apparatus of claim 23, wherein the second thermally conductive layer is disposed over the one or more temperature sensors.

25. The electric heater apparatus of claim 16, wherein the one or more heating elements and the disc comprise a functionally similar coefficient of thermal expansion to avoid deleterious cracks or fissures in the electric heater apparatus.

26. The electric heater apparatus of claim 16, wherein the one or more heating elements are independently controllable to provide one or more heating zones along the top side of the disc.

* * * * *